United States Patent
Xie et al.

(10) Patent No.: US 11,740,308 B2
(45) Date of Patent: Aug. 29, 2023

(54) REMOVING RF INTERFERENCE OF PILOT TONE SIGNAL IN MRI SYSTEM

(71) Applicant: Siemens Healthcare GmbH, Erlangen (DE)

(72) Inventors: Shu Qun Xie, Shenzhen (CN); Yan Tu Huang, Shenzhen (CN); Fang Dong, Shenzhen (CN)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 17/405,285

(22) Filed: Aug. 18, 2021

(65) Prior Publication Data

US 2022/0057465 A1 Feb. 24, 2022

(30) Foreign Application Priority Data

Aug. 18, 2020 (CN) .......................... 202010830359.7

(51) Int. Cl.
  *G01V 3/00* (2006.01)
  *G01R 33/54* (2006.01)
  *G01R 33/56* (2006.01)

(52) U.S. Cl.
  CPC ....... *G01R 33/543* (2013.01); *G01R 33/5608* (2013.01)

(58) Field of Classification Search
  CPC .............. G01R 33/3415; G01R 33/543; G01R 33/5659; G01R 33/36; A61B 5/055
  USPC .......................................................... 324/309
  See application file for complete search history.

(56) References Cited

U.S. PATENT DOCUMENTS

2018/0353139 A1 12/2018 Speier et al.
2018/0353140 A1* 12/2018 Speier .................. A61B 5/7289

FOREIGN PATENT DOCUMENTS

CN         112147555 A      12/2020
JP         2001204709 A  *   7/2001
WO     WO-2012118442 A1  *   9/2012  ............. G01N 24/08

* cited by examiner

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

A signal processing method including receiving an original reference radio frequency signal from a receiving antenna group; receiving the time series of the control signal associated with the transmission event of the radio frequency pulses; synchronizing the time series with the original reference radio frequency signal, and determining the echo train in the original reference radio frequency signal in a repetition time of the pulse sequence, wherein the echo train corresponds to the part of the time series associated with the transmission event of the radio frequency pulses in time sequence; setting the sampling points in the domains of the starting point and a first ending point of the echo train; and generating a fitting signal based on the sampling points to eliminate the radio frequency interference signal resulted from the transmission event of the radio frequency pulses.

27 Claims, 11 Drawing Sheets

REMOVING RF INTERFERENCE OF PILOT TONE SIGNAL IN MRI SYSTEM

TECHNICAL FIELD

The present disclosure relates to the technical field of medical devices, and in particular to a method and a device for removing interference signals from pilot tone signals.

BACKGROUND

Magnetic resonance imaging (MRI) is a medical imaging technology that uses an antenna to irradiate an object with a radio frequency pulse signal under certain magnetic field conditions, and forms images based on the modulated radio frequency signal received from the object. Magnetic resonance imaging can be used to study the internal structure, material composition, and physiological processes of the object. The radio frequency pulse with the Larmor frequency causes precession at a deflection angle of the spinning nucleus, such as hydrogen nucleus (i.e., $H^+$), in the irradiated object, and generates a magnetic resonance radio frequency signal after excitation, which is received by a receiving coil/antenna and processed by a computer for imaging. The images of the inside of the object drawn by this method can reflect the spatial distribution, type and other information of the spinning nucleus constituting the object.

With the aid of a gradient magnetic field, these radio frequency pulse signals applied on the object for irradiation are position-encoded. The position-encoding allows the received signal to be associated with the volume element. Then, the received signal is analyzed, and stereo imaging of the inspected object is provided.

Depending on the pulse sequence used (also called the sequence), image acquisition in a magnetic resonance imaging system takes a few milliseconds to a few seconds. Therefore, it makes sense to start image acquisition at the beginning when the body remains immobile to avoid artifacts due to motion during image acquisition. But movements such as breathing and heartbeat are inevitable. However, there is a tranquil period after a period of motion, for example, after breathing or myocardial contraction. Image acquisition at this stage is expected to have a relatively long period with little movement, so that the best measurement results are expected here.

In addition, motion information is collected with the help of some high-frequency signals or radio frequency signals and other reference radio frequency signals. Here, in the k-space record of the magnetic resonance imaging equipment related to the patient, the data or information related to the patient's mechanical movement can be read by some modulation and decoding methods, so as to identify the patient's movements caused by breathing or heartbeat.

SUMMARY

In view of this, one aspect of the present disclosure discloses a signal processing method, used to determine and eliminate radio frequency interference signals during the process where an MRI device collects an original reference radio frequency signal associated with the mechanical movement of a measured object, especially the radio frequency interference signals caused by the transmission event related to the radio frequency pulses introduced during the image acquisition process of the MRI device. The signal processing method comprises: receiving the original reference radio frequency signal from a receiving antenna group; receiving the time series of the control signal associated with the transmission event of the radio frequency pulses; synchronizing the time series with the original reference radio frequency signal, and determining the echo train in the original reference radio frequency signal in a repetition time of the pulse sequence, wherein the echo train corresponds to the part of the time series associated with the transmission event of the radio frequency pulses in time sequence; setting the sampling points in the domains of the starting point and a first ending point of the echo train, and generating a fitting signal based on the sampling points to eliminate the radio frequency interference signal resulted from the transmission event of the radio frequency pulses, wherein the point in the time series corresponding to the ending point of the transmission event of the radio frequency pulses is determined as the first ending point.

Optionally, setting the sampling points in the domains of the starting point and the first ending point of the echo train comprises: calculating the amplitude changes of adjacent sampling points in the domains of the starting point and the first ending point, and selecting at least one sampling point with the amplitude change within an a priori first threshold respectively in the domains of the starting point and the first ending point as fitting points; generating the fitting signal by a fitting algorithm based on the fitting points, wherein the first threshold is determined according to the maximum amplitude change of the part of the original reference radio frequency signal that is not affected by the transmission event of the radio frequency pulses.

Optionally, after setting the sampling points in the domains of the starting point and the first ending point of the echo train and generating a fitting signal based on the sampling points to eliminate the radio frequency interference signal resulted from the transmission event of the radio frequency pulses, the method comprises: in response to obtaining a complete repetition time, determining the difference between the original reference radio frequency signal and the fitting signal as the radio frequency interference signal in a repetition time; in the current repetition time, determining the difference between the original reference radio frequency signal and the average of the radio frequency interference signals in all the previous repetition times as the reference radio frequency signal in the current repetition time.

Optionally, setting the sampling points in the domains of the starting point and the first ending point of the echo train comprises: the domain of the first ending point further comprises a second ending point determined by the time for the interference level in the echo train to return to the reference level; setting the sampling points in the domain of the second ending point, calculating the amplitude changes of the sampling points, and selecting at least one sampling point with the amplitude change within the first threshold as a fitting point.

Optionally, setting the sampling points in the domains of the starting point and the first ending point of the echo train and generating a fitting signal based on the sampling points to eliminate the radio frequency interference signal resulted from the transmission event of the radio frequency pulses comprises: comparing the length between the echo train and the normal respiratory cycle, or comparing the length between the time interval of adjacent radio frequency pulses transmitted in the echo train, as a second threshold, and the time for the original reference radio frequency signal to return from the interference level to the reference level; deciding whether to divide the echo train based on the result of the comparison.

Optionally, deciding whether to divide the echo train comprises: in response to the length of the echo train being shorter than the selected part of the normal respiratory cycle, or in response to the time for the original reference radio frequency signal to return from the interference level to the reference level being longer than the second threshold, selecting at least one sampling point with the amplitude change within the first threshold in the domain of the starting point of the echo train as a first fitting point and at least one sampling point with the amplitude change within the first threshold in the domain of the first ending point of the echo train as a second fitting point; generating the fitting signal by linear fitting of the first fitting point and the second fitting point.

Optionally, deciding whether to divide the echo train comprises: in response to the length of the echo train being longer than the selected part of the normal respiratory cycle, or in response to the time for the original reference radio frequency signal to return from the interference level to the reference level being shorter than the second threshold, dividing the echo train into a plurality of echo train sections.

Optionally, in response to the length of the echo train being longer than the selected part of the normal respiratory cycle, or in response to the time for the original reference radio frequency signal to return from the interference level to the reference level being shorter than the second threshold, dividing the echo train into a plurality of echo train sections comprises: selecting at least one sampling point with the amplitude change within the first threshold respectively in the domains of the starting point and the first ending point of each of the echo train sections as fitting points to forma plurality of fitting points; fitting the plurality of fitting points by a nonlinear fitting algorithm to generate the fitting signal.

Optionally, in response to the length of the echo train being longer than the selected part of the normal respiratory cycle, or in response to the time for the original reference radio frequency signal to return from the interference level to the reference level being shorter than the second threshold, dividing the echo train into a plurality of echo train sections comprises: selecting at least one sampling point with the amplitude change within the first threshold respectively in the domains of the starting point and the first ending point of each of the echo train sections as fitting points to forma plurality of fitting points; fitting adjacent fitting points by use of a linear fitting algorithm and generating a polysegment fitting signal.

Optionally, synchronizing the time series with the original reference radio frequency signal, and determining the echo train in the original reference radio frequency signal in a repetition time, wherein the echo train corresponds to the part of the time series associated with the transmission event of the radio frequency pulses in time sequence, comprises: tracking changes of the time series of the control signal in real time, and detecting, from the time series, the start of the transmission event of the radio frequency pulses.

Optionally, determining the echo train in the original reference radio frequency signal in a repetition time, wherein the echo train corresponds to the part of the time series associated with the transmission event of the radio frequency pulses in time sequence, comprises: in response to detecting, from the time series, the start of the transmission event of the radio frequency pulses, reading the original reference radio frequency signal into a buffer, and maintaining the change to the time series; deciding whether the repetition time has ended.

Optionally, the original reference radio frequency signal comprises an original pilot tone signal.

Another aspect of the present disclosure provides a signal processing device, used to determine and eliminate radio frequency interference signals during the process where an MRI device collects an original reference radio frequency signal associated with the physiological signals of the mechanical movement of a measured object. The signal processing device comprises: a control unit, configured to receive the original reference radio frequency signal from a receiving antenna group, and receive the time series of the control signal associated with the transmission event of the radio frequency pulses; wherein the control unit comprises a system clock, and synchronizes the time series of the control signal with the original reference radio frequency signal by the system clock; an identification unit, configured to determine the echo train in the original reference radio frequency signal in a repetition time of the pulse sequence, wherein the echo train corresponds to the part of the time series associated with the transmission event of the radio frequency pulses in time sequence; a fitting signal unit, configured to set the sampling points in the domains of the starting point and a first ending point of the echo train, and generate a fitting signal based on the sampling points to eliminate the radio frequency interference signal resulted from the transmission event of the radio frequency pulses, wherein the point in the time series corresponding to the ending point of the transmission event of the radio frequency pulses is determined as the first ending point.

Optionally, the fitting signal unit is also configured to calculate the amplitude changes of adjacent sampling points in the domains of the starting point and the first ending point of the echo train, and select at least one sampling point with the amplitude change within an a priori first threshold respectively in the domains of the starting point and the first ending point as fitting points; generate the fitting signal by a fitting algorithm based on the fitting points, wherein the first threshold is determined according to the maximum amplitude change of the part of the original reference radio frequency signal that is not affected by the transmission event of the radio frequency pulses.

Optionally, the signal processing device further comprises: a reference radio frequency signal processing unit, configured to, in response to a complete repetition time, determine the difference between the original reference radio frequency signal and the fitting signal as the radio frequency interference signal in a repetition time, and, in the current repetition time, determine the difference between the original reference radio frequency signal and the average of the radio frequency interference signals in all the previous repetition times as the reference radio frequency signal in the current repetition time.

Optionally, the identification unit is also configured to determine the point in the time series corresponding to the ending point of the transmission event of the radio frequency pulses as the first ending point, and the domain of the first ending point further comprises a second ending point determined by the time for the interference level in the echo train to return to the reference level; the fitting signal unit is configured to set the sampling points in the domain of the second ending point, calculate the amplitude changes of the sampling points, and select at least one sampling point with the amplitude change within the first threshold as a fitting point.

Optionally, the fitting signal unit is also configured to compare the length between the echo train and the normal respiratory cycle, or compare the length between the time interval of adjacent radio frequency pulses transmitted in the echo train, as a second threshold, and the time for the original reference radio frequency signal to return from the interference level to the reference level; decide whether to divide the echo train based on the result of the comparison.

Optionally, the fitting signal unit is also configured to, in response to the length of the echo train being shorter than the selected part of the normal respiratory cycle, or in response to the time for the original reference radio frequency signal to return from the interference level to the reference level being longer than the second threshold, select at least one first sampling point with the amplitude change within the first threshold in the domain of the starting point of the echo train and at least one second sampling point with the amplitude change within the first threshold in the domain of the first ending point of the echo train; generate the fitting signal by fitting of the first fitting point and the second fitting point by use of a linear fitting algorithm.

Optionally, the fitting signal unit is also configured to, in response to the length of the echo train being longer than the selected part of the normal respiratory cycle, or in response to the time for the original reference radio frequency signal to return from the interference level to the reference level being shorter than the second threshold, divide the echo train into a plurality of echo train sections.

Optionally, the fitting signal unit is also configured to select at least one sampling point with the amplitude change within the first threshold respectively in the domains of the starting point and the first ending point of each of the echo train sections as fitting points, to form a plurality of fitting points; fit the plurality of fitting points by a nonlinear fitting algorithm to generate the fitting signal.

Optionally, the fitting signal unit is also configured to select at least one sampling point with the amplitude change within the first threshold respectively in the domains of the starting point and the first ending point of each of the echo train sections as fitting points, to form a plurality of fitting points; fit adjacent fitting points by use of a linear fitting algorithm and generate a poly-segment fitting signal.

Optionally, the identification unit is configured to track changes of the time series of the control signal in real time, and detect, from the time series, the start of the transmission event of the radio frequency pulses.

Optionally, the identification unit is configured to, in response to detecting, from the time series, the start of the transmission event of the radio frequency pulses, read the original reference radio frequency signal into a buffer, track the change of the time series, and decide whether the repetition time has ended.

Optionally, the original reference radio frequency signal comprises an original pilot tone signal.

Another aspect of the present disclosure provides a magnetic resonance imaging device, able to determine relevant physiological signals based on the mechanical movement of a measured object. The magnetic resonance imaging device comprises: the signal processing device as described above.

Another aspect of the present disclosure provides an electronic device. The electronic device comprises: a controller; a memory storing a program, wherein the program comprises instructions that, when executed by the controller, causes the controller to execute the signal processing method as described above.

Another aspect of the present disclosure provides a computer-readable storage medium storing a program, wherein the program comprises instructions that, when executed by the processor of the electronic device, cause the electronic device to execute the signal processing method as described above.

An advantage of the signal processing method and device provided by the present disclosure is the reference radio frequency signal. If the pilot tone signal has reproducibility in terms of the pulse sequence of each repetition time in the physical and the statistical aspects, it will be possible to determine the radio frequency interference signal by calculation in a more economical manner, i.e., by use of a fitting algorithm, to subtract the average value of the radio frequency interference signal in the previous repetition times from the original pilot tone signal in the current repetition period, which can effectively reduce the error probability of the fitting algorithm and reduce the impact of jump signals occurring in a repetition time.

Another advantage is that the signal processing method provided by the present disclosure can be applied to processing abnormal interference in some magnetic resonance sequences, such as the Trufi sequence or the Haste sequence.

Another advantage is that the signal processing method provided by the present disclosure can distinguish among short echo trains, echo trains of special lengths, and radio frequency pulses in an echo train sent at a relatively long time interval, based on echo trains of different lengths or the characteristics of the length of the time interval between adjacent radio frequency pulses in echo trains, and the proper fitting algorithm is adopted to obtain high-quality pilot tone signals/reference radio frequency signals.

BRIEF DESCRIPTION OF THE DRAWINGS

The aspects of the present disclosure will be described in detail below with reference to the drawings, so that those skilled in the art will better understand the above and other features and advantages of the present disclosure. In the drawings.

Figure 1:
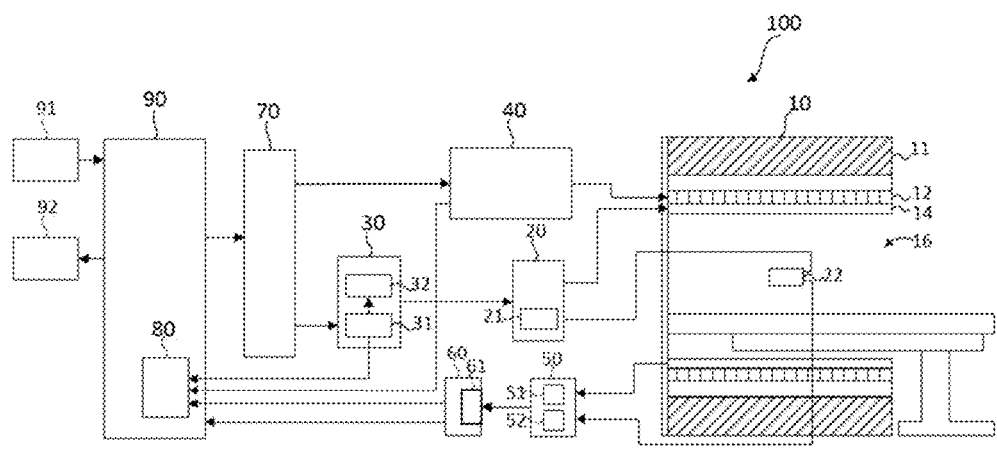
FIG. 1 is a schematic diagram of the MRI system according to the present disclosure, with a pilot tone transmitter 21 and a pilot tone receiver 52 according to an exemplary aspect.

In the Drawings, the Following Symbols are Used:
100 MRI device
10 Magnet unit
11 Field magnet
12 Gradient coil
14 Body coil
16 Patient passage
20 Radio frequency transmission coil
21 Pilot tone transmitter
22 Local coil
30 Radio frequency transmission unit
31 Radio frequency transmission controller
32 Oscillator
40 Gradient unit
50 Receiving antenna group
51 Receiving coil
52 Pilot tone receiver
60 Receiver
61 Receiving coil channel selector
70 Pulse sequence generator
80 Signal processing device
81 Control unit
82 System clock
83 Identification unit
830 Original reference radio frequency signal/pilot tone signal affected by radio frequency interference signals
831 Echo train
832 Recovery section of reference radio frequency signal/pilot tone signal
84 Buffer
85 Fitting signal unit
851 Fitting point
852 Fitting signal
853 Echo train section
86 Reference radio frequency signal processing unit
90 Computer
91 User input interface
92 Display device
T Normal respiratory cycle
Ts Time series
$T_1$ Length of the echo train
$T_2$ Time interval of the transmission of adjacent radio frequency pulses
$T_3$ Time for the original reference radio frequency signal to return from the interference level to the reference level
Interf_Sig$_{TR(i)}$ Radio frequency interference signal in the ith repetition time
PT_Og_Sig$_{TR(i)}$ Original pilot tone signal in the ith repetition time
Fit_Sig$_{TR(i)}$ Fitting signal in the ith repetition time
PT_Sig$_{TR(i+1)}$ Pilot tone signal in the (i+1)th repetition time

DETAILED DESCRIPTION

In order to have a clearer understanding of the technical features, purpose and effects of the present disclosure, the specific aspects of the present disclosure will be described below with reference to the drawings. In the drawings, the same reference numerals represent the same parts.

Here, "exemplary" means "serving as an example, instance or illustration", and any illustration or aspect described as "exemplary" here may not be construed as a more preferred or advantageous technical solution.

For simplification, the drawings only schematically show the parts related to the present disclosure, and do not represent the actual structure of a product. In addition, in order to make the drawings simple and easy to understand, only one of the parts of the same structure or function in some drawings is shown as an example, or only one of them is indicated.

Here, "one" not only means "only this one", but may also mean "more than one". Here, "first", "second", etc. are only used to distinguish them from each other, rather than indicating their importance and order, or being the premise of the existence of one another, etc. In addition, the term "and/or" used in the present disclosure covers any one and all of the possible combinations of the listed items. For example, A and/or B may mean three situations, i.e., A existing alone, A and B existing at the same time, and B existing alone. Furthermore, the character in the text generally means that the associated objects before and after it are in m "or" logic.

In an MRI system, the reference radio frequency signal, for example, a pilot tone (PT), is extracted from the original signal based on the modulation of the respiratory signal of the MR receiver. It can be used as a trigger feature for magnetic resonance signal acquisition and to track respiratory movement.

FIG. 1 is a schematic diagram of the MRI system according to the present disclosure, with a pilot tone transmitter 21 and a pilot tone receiver 52 according to an exemplary aspect.

As shown in FIG. 1, the magnet unit 10 has a field magnet 11, and the field magnet 11 generates a uniform magnetostatic field $B_0$ in the measurement area, which is used to align the nuclear spin of the measured object or patient. The uniformity of the static magnetic field $B_0$ is particularly related to the intensity or magnitude of the magnetic field. The measurement area is arranged in the patient passage 16 and can be moved by a mobile unit. The field magnet 11 is usually a superconducting magnet that can provide a magnetic flux density of 1.5 T or 3.0 T and even higher magnetic fields when the state-of-the-art equipment is used. However, for a lower field intensity, permanent magnets or electromagnets with ordinary conductive coils can also be used.

In addition, the magnet unit 10 further comprises a gradient coil 12. The gradient coil 12 is configured to superimpose the magnetic field $B_0$ on a variable magnetic field in three spatial directions, so as to spatially distinguish the imaged area of the examined volume where data is to be collected. The gradient coil 12 is usually a coil composed of an ordinary conductive metal wire, which can generate fields orthogonal to each other in the examined volume.

The magnet unit 10 further comprises a body coil 14. The body coil 14 is configured to radiate a radio frequency signal fed via a signal wire into the examined volume, receive a resonance signal sent from the patient, and transmit it via the signal wire.

The pulse sequence generator 70 provides the magnet unit 10 with different signals for the gradient coil 12 and the body coil 14.

The gradient unit 40 can be configured to receive a set of pulse sequences related to the gradient field from the pulse sequence generator 70 for supplying a variable current to the gradient coil 12 via a feeder line, and the variable current provides the desired gradient field in the examined volume in a time coordinated manner.

In the part of radio frequency transmission, the radio frequency transmission unit 30 can be configured to receive a set of pulse sequences related to exciting the radio frequency transmitting coil from the pulse sequence generator 70, which is used to generate high frequency pulses/radio frequency pulses with a predetermined time direction, amplitude and spectral power distribution, for magnetic resonance to excite the nuclear spins in the patient in the measurement area. Here, pulse power in the kilowatt range can be achieved. The excitation pulses can be radiated to the patient by the body coil 14 and/or the radio frequency transmitting coil 20. The radio frequency transmission unit 30 may comprise a radio frequency transmission controller 31 that receives pulse sequences from the pulse sequence generator 70, wherein the radio frequency transmission controller 31 may have a control signal for controlling the radio frequency transmitting coil 20 to transmit radio frequency pulses, the control signal may indicate, in a time series, the timing of the radio frequency pulses generated by the radio frequency transmitting coil 20 and sent to the measured object, and the control signal can be generated based on a pulse sequence; an oscillator 31, wherein the oscillator 31 can generate high frequency pulses/radio frequency pulses with the corresponding time direction, amplitude and spectral power distribution based on a pulse sequence. Here, the high frequency pulses/radio frequency pulses generated by the oscillator 31 can be amplified by a radio frequency signal preamplifier. Here, the radio frequency transmitting coil may comprise a local coil 22 arranged at the near-end of the patient. The control signal may also comprise a gradient pulse sequence generated by the gradient unit 40, so that the gradient coil 12 generates a gradient magnetic field based on the gradient pulse sequence, and the position information of the radio frequency pulse signal is encoded through the spatial change of the magnetic field. Here, the control signal may be associated with any radio frequency pulse transmission event expressed in a time series, to control radio frequency transmission events including without limitation to the radio frequency transmission generated by the body coil 14, the local coil 22 and the gradient coil 12, the modulation and demodulation of the local coil 22, etc.

The local coil 22 can be arranged at the near-end of the patient, and the local coil 22 can be connected to the radio frequency transmission unit 30 and the receiving antenna group 50 through connecting lines. The receiving antenna group 50 can feed the received magnetic resonance signal in the form of an analog signal and/or the original reference radio frequency signal associated with the physiological signal of the mechanical movement of the measured object to the receiver 60 through a signal line. The receiver 60 may comprise a receiving coil channel selector 61, which can output the magnetic resonance signal and/or the original reference radio frequency signal separately to one channel to form multiple channels. The receiver 60 can convert the above analog signal into a digital signal, and then output it to the computer 90 for processing. The computer 90 may comprise at least a reconstruction unit/device, and the reconstruction unit/device may at least use an inverse Fourier transform operation to reconstruct, from the magnetic resonance signal, spatially distinguished images with respect to substances that reflect the anatomy of the object or patient measured. The display device 92 can provide display and playback of the reconstructed images and cinematic.

In addition, the computer 90 further comprises a user input interface 91 for providing user operations such as input, selection and interaction. The user input interface 91 may comprise at least: a keyboard, a mouse, a touch screen, etc.

In the part of radio frequency transmission, the radio frequency transmitting coil 20 further comprises: a pilot tone transmitter 21. The pilot tone transmitter 21 can be connected to the local coil 22, or arranged around the local coil 22, or the local coil 22 has a separate transmitting antenna for pilot tone signals that is used to send pilot tone signals. In addition, it is also conceivable to arrange a separate transmitting antenna for pilot tone signals in the patient passage 16 or at some anatomical positions of the patient. In some applications and technical advantages, the pilot tone transmitter 21 can be arranged in the local coil 22.

The part for receiving radio frequency signals may comprise a pilot tone receiver 52. The pilot tone receiver 52 may be signal-connected to the local coil 22, and the local coil 22 may have a receiving antenna for receiving pilot tone signals. In addition, receiving antennas for receiving pilot tone signals are arranged in the patient passage 16 or at some anatomical positions of the patient. In some illustrated aspects, the pilot tone receiver 52 may be configured as one or more antenna coils of the local coil 22 for receiving magnetic resonance signals. Here, the pilot tone receiver 52 may be the same as the receiver 60 for magnetic resonance signals, or one or more channels in the receiving coil channel selector 53 of the receiver 60 may be used to receive pilot tone signals, and the pilot tone receiver 52 can only apply some additional processing steps in the form of a filter or algorithm to the signal of the antenna coil to extract the pilot tone signal. At the same time, based on some applications and technical advantages, the pilot tone receiver 52 can be arranged in the local coil.

The pilot tone transmitter 21 generates a pilot tone signal, which can be transmitted into some anatomical positions of the patient via an inductive ring/antenna. To this end, the pilot tone transmitter 21 may comprise a separate oscillator, which can generate a radio frequency/high frequency signal at a suitable frequency. In some illustrated aspects, when the frequency is preferably within the Larmor frequency or a frequency range near the Larmor frequency used by the MRI device 100 during imaging, the pilot tone transmitter 21 may be substituted, and the oscillator 31 in the radio frequency transmission unit 30 can feed the radio frequency signal, or the radio frequency signal can be generated based on the fed signal in the pilot tone transmitter 21, so as to maintain the stability of the pilot tone signal while collecting the magnetic resonance signal.

Some advantageous ways can be implemented to better separate the pilot tone signal from the magnetic resonance signal, reduce or eliminate the interaction between the two, so that monitoring physiological signals and motion information by the pilot tone and signal image acquisition by the magnetic resonance signal will not interfere each other. In an advantageous way shown, one modulation method, such as amplitude modulation, frequency modulation, or phase modulation, may be used at the pilot tone transmitter 21 to modulate the pilot tone signal and modulate it to a radio frequency/high frequency signal at a certain frequency. Methods such as quadrature phase modulation may also be used. As a result of the implementation of the above method, the position occupied by the pilot tone signal in k-space will not intersect with the magnetic resonance signal. It is understandable that the use of the methods including encoding and modulation at the pilot tone transmitter 21 can eliminate the interference caused by the magnetic resonance signal during the image acquisition process, and realize the separation of the reference radio frequency signal including the pilot tone signal and the magnetic resonance signal.

Since the pilot tone signal is usually very weak, it will be interfered by the scanning of the pulse sequence required for MRI during reception, i.e., interferences including that from the radio frequency transmitting coil 20, that the stage where the local coil 22 transmits radio frequency pulses/power, and dynamic tuning and dynamic demodulation will affect the scanning results of the application protocol associated with the pilot tone signal. Based on the existing hardware framework, it is difficult to remove or reduce the impact of radio frequency interference through hardware solutions.

Figure 2:
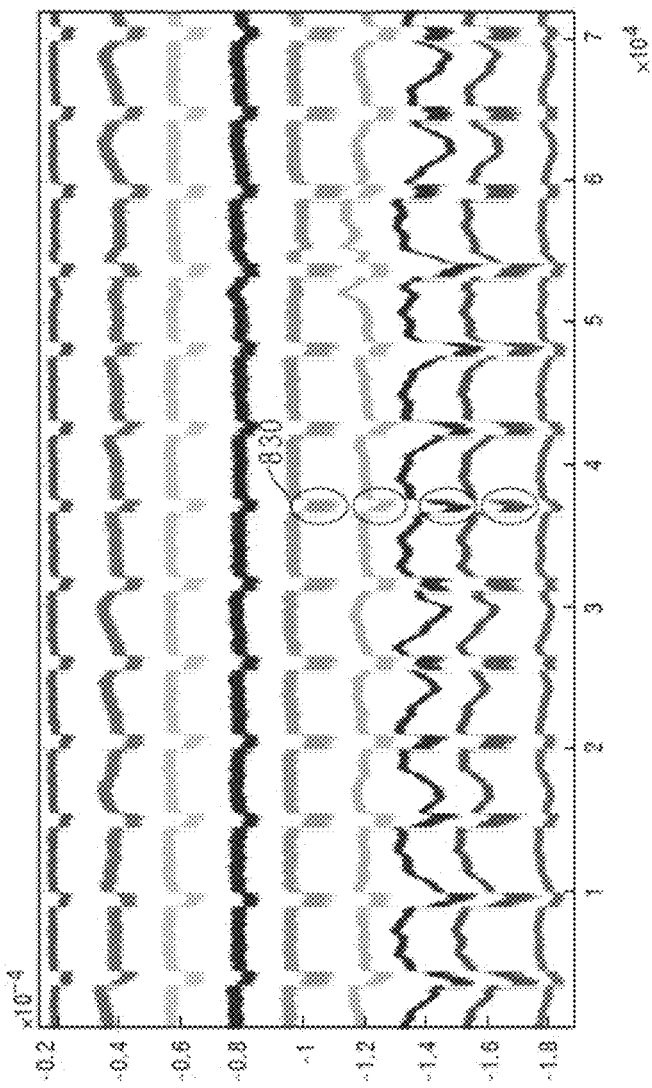
FIG. 2 is a schematic diagram of a multi-channel reference radio frequency signal/pilot tone signal and the signal affected by a radio frequency interference signal according to an exemplary aspect.

FIG. 2 is a schematic diagram of a multi-channel reference radio frequency signal/pilot tone signal and the original reference radio frequency signal/pilot signal 830 affected by a radio frequency interference signal according to an exemplary aspect.

As shown in FIG. 2, an example of the radio frequency interference identified in a multi-channel pilot signal is given, and it can be observed that the level of the radio frequency interference signal caused by the transmission event of the radio frequency pulse sequence can be comparable to or exceed the level of the respiratory modulation signal; if the radio frequency interference in each channel is not removed, the combination of the reference radio frequency signal/pilot tone signal in each channel will cause quality degradation, distortion and other problems.

Here, according to some illustrated aspects, the transmission event of the radio frequency pulse (sequence) may comprise without limitation: transmitting, by the radio frequency transmitting coil 20, including the local coil 22 and the pilot tone transmitter 21, a radio frequency pulse sequence to the measured object/patient, which is used to generate a non-uniform field $B_1$, and providing, by the gradient pulse sequence sent by the gradient coil, spatial encoding for the radio frequency pulse sequence through a gradient magnetic field, or dynamic tuning/demodulation of the radio frequency transmitting coil 20, etc.

Here, it should be noted that the receiver 60 can provide a receiving coil channel selector 61 that can output the magnetic resonance signal and/or the original reference radio frequency signal of the receiving antenna group 50 to multiple channels to form the above-mentioned multiple channels.

According to some aspects, the reference radio frequency signal/pilot tone signal may be stored in a certain data structure or in a specific form of template for easy reading, and it is possible to plot multi-channel reference radio frequency signals/pilot tone signals after reading.

To this end, the present disclosure provides an MRI device 100 that is able to determine relevant physiological signals based on a reference radio frequency signal associated with the mechanical motion of a measured object, comprising: a signal processing device 80, used to determine and eliminate radio frequency interference signals during the process of collecting the original reference radio frequency signal/pilot tone signal associated with the physiological signal of the mechanical movement of a measured object by radio frequency signals in MRI, wherein it eliminates the impact of radio frequency interference signals and restores the reference radio frequency signal by use of a fitting signal, based on the synchronicity in the transmission, dynamic tuning and/or demodulation of the interference signal and the radio frequency pulse sequence, wherein, the physiological signal is in the form such as a waveform reflecting the respiratory signal, heartbeat, heart rate or heart rhythm of the measured/examined patient.

For this, the signal processing device 80 provided in the present disclosure for determining and eliminating radio frequency interference signals in the original reference radio frequency signal/pilot tone signal will be described in detail with reference to the accompanying drawings.

Figure 3:
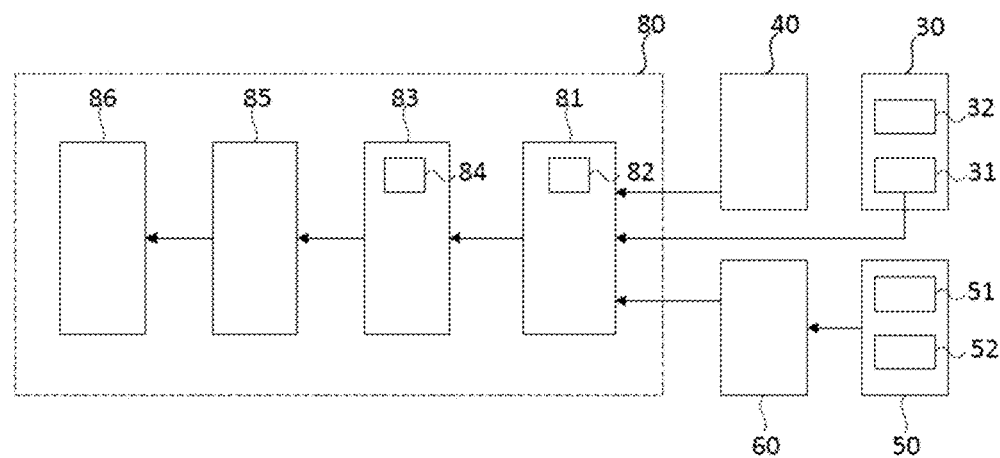
FIG. 3 is a functional block diagram of a signal processing device 80 used to determine and eliminate radio frequency interference signals according to an exemplary aspect.

FIG. 3 is a functional block diagram of the signal processing device 80 used to determine and eliminate radio frequency interference signals in the original reference radio frequency signal/pilot tone signal according to an exemplary aspect.

As shown in FIG. 3, the signal processing device 80, which receives the original reference radio frequency signal associated with mechanical movement from the receiving antenna group 50, and eliminates the interference signal transmitted with the radio frequency sequence in the original reference radio frequency signal, comprises: a control unit 81, configured to receive the original reference radio frequency signal associated with a mechanical physiological signal from the receiving antenna group 50, and receive the time series used to control the transmission of the radio frequency pulses by the radio frequency transmitting coil 20 and/or control the transmission of a gradient pulse sequence by the gradient coil 12; wherein the control unit 81 comprises a system clock 82, and synchronizes the time series with the original reference radio frequency signal by the system clock 82; an identification unit 83, configured to determine the echo train 831 in the original reference radio frequency signal in a repetition time of the pulse sequence, wherein the echo train 831 corresponds to the part of the time series associated with the transmission event of the radio frequency pulses in time sequence; a fitting signal unit 85, configured to set the sampling points in the domains of the starting point and a first ending point of the echo train 831, and generate a fitting signal 852 based on the sampling points to eliminate the radio frequency interference signal resulted from the transmission event of the radio frequency pulses, wherein the point in the time series Ts corresponding to the ending point of the transmission event of the radio frequency pulses is determined as the first ending point. In addition, it is easy to understand that the point in the time series Ts corresponding to the start of the transmission event of the radio frequency pulses can help determine the start of the echo train 831.

A pulse sequence refers to a set of radio frequency (and/or gradient) pulses and the time interval between these pulses. The repetition time (TR) is a major parameter of a pulse sequence. It refers to the period of time from the beginning of a pulse sequence to the beginning of the next pulse sequence, and the pulse sequences occur periodically and identically.

That the echo train 831 corresponds to the part of the control signal associated with the transmission event of the radio frequency pulses can be understood as that the part of the control signal associated with the transmission event of the radio frequency pulses can be used to determine that the reason for the generation of the echo train 831 in the received original reference radio frequency signal is related to this.

The reference radio frequency signal is defined as, in the field of magnetic resonance imaging, through transmitting a signal modulated to a high frequency/radio frequency to the local anatomical position of a measured object or patient under the excitation of a non-uniform magnetic field, the magnetic resonance signal generated by the precession of the aligned nuclear spins at the Larmor frequency, with the modulated high frequency/radio frequency signal received by a receiving antenna, which reflects the physiological signals related to the movement of the mechanical systems of the measured object or patient, such as heartbeat, respiration and other periodic movements, and is used to track physiological signals such as heartbeat, respiratory cycle, etc. The reference radio frequency signal may include: a pilot tone signal, a pilot signal, etc., may have a suitable high frequency/radio frequency, etc., and may be modulated to the Larmor frequency or a range near the Larmor frequency in some illustrated aspects. In addition, the original reference radio frequency signal associated with the reference radio frequency signal can be defined as a signal that is mixed and superimposed with radio frequency interference signals. Based on observations, it is found that the phenomenon that interference signals are mixed and superimposed in the original reference radio frequency signal is highly related to transmission of a radio frequency pulse sequence by the radio frequency transmitting coil 20, dynamic tuning/demodulation, etc. Therefore, it can be determined that the echo train 831 in the original reference radio frequency signal is synchronized with the time sequence of the control signal based on the repetition time as the basic timing unit, wherein the control signal records information including the transmitted radio frequency pulse sequence, dynamic tuning/demodulation, etc. Based on the echo train 831 corresponding to the part in the control signal reflecting the transmission and dynamic tuning/demodulation of the radio frequency pulse sequence, the starting position and the ending position of the interference in the echo train 831 can be determined. A further preferred method is to generate a fitting signal based on the points not interfered in the domains of both the starting and ending positions in the echo train 831 to eliminate the radio frequency caused by the transmission of the radio frequency pulse sequence, dynamic tuning/demodulation, etc. The concept of this aspect is to use the fitting signal to correct the original reference radio frequency signal to eliminate the impact of radio frequency interference signals and obtain a reference radio frequency signal of better quality.

According to some illustrated aspects, the transmission event of the radio frequency pulses (sequence) may comprise: the radio frequency pulses such as those of the field $B_1$ generated by the body coil 14, or a radio frequency pulse sequence at the Larmor frequency transmitted by the radio frequency transmitting coil 20, including the local coil 22, to the measured object/patient, which is used to generate a non-uniform field $B_1$, a gradient pulse sequence sent by the gradient coil 12, which provides spatial encoding for the radio frequency pulse sequence through a gradient magnetic field, or dynamic tuning/demodulation by the local coil 22, etc.

In addition, it is possible to receive, from the radio frequency transmission controller 31, a control signal in relation to the transmission of the radio frequency pulse sequence by the radio frequency transmitting coil 20, or the information about the control signal in relation to the transmission of the radio frequency pulses (sequence) can be obtained by switching a transmitting/receiving switch, or information about the time sequence and control signal, etc. of the radio frequency pulse sequence and/or gradient pulse sequence can be received by the pulse sequence generator 70, or the time series Ts and/or the control signal, etc. in relation to the transmission of the gradient pulse sequence can be received by the gradient unit 40.

Moreover, according to some aspects, the control unit 81 may also be configured to receive the time series Ts in relation to the gradient pulse sequence sent by the gradient coil 12 through the gradient unit 40. The time series Ts may comprise: the time sequence Ts related to the control signal of a radio frequency pulse sequence, or the time sequence Ts related to the control signal in relation to a gradient pulse sequence, or the time sequence Ts of the control signal in relation to a mixture of a radio frequency pulse sequence and a gradient pulse sequence.

According to some aspects, the control unit 81 may receive the original reference radio frequency signal, such as a pilot tone signal, through one or more channels received from the receiving antenna group 50 in the receiving coil channel selector 61 of the receiver 60. The receiving antenna group 50 may comprise a specially set pilot tone receiver 52 to receive pilot tone signals, and the receiving coil channel selector 61 may provide multiple channels. In addition, the receiver 60 may comprise an analog-to-digital converter, which converts the reference radio frequency signal and the magnetic resonance signal comprising the pilot tone signal into a digital signal for separation and processing, which is not limited in this aspect.

Therefore, according to some aspects, the original reference radio frequency signal received through multiple channels can be stored in a buffer in a certain data structure form so that it can be read. Here, the time series and pilot tone signal in relation to the transmission of a radio frequency pulse sequence and stored in the form of a certain data structure may comprise: parameters of the pulse sequence, such as the time period, etc. Based on the above method, the changes of the radio frequency pulse sequence in the time sequence can be tracked in real time in a time period, such as the detection of a transmission event of the radio frequency pulses (sequence).

Figure 4:
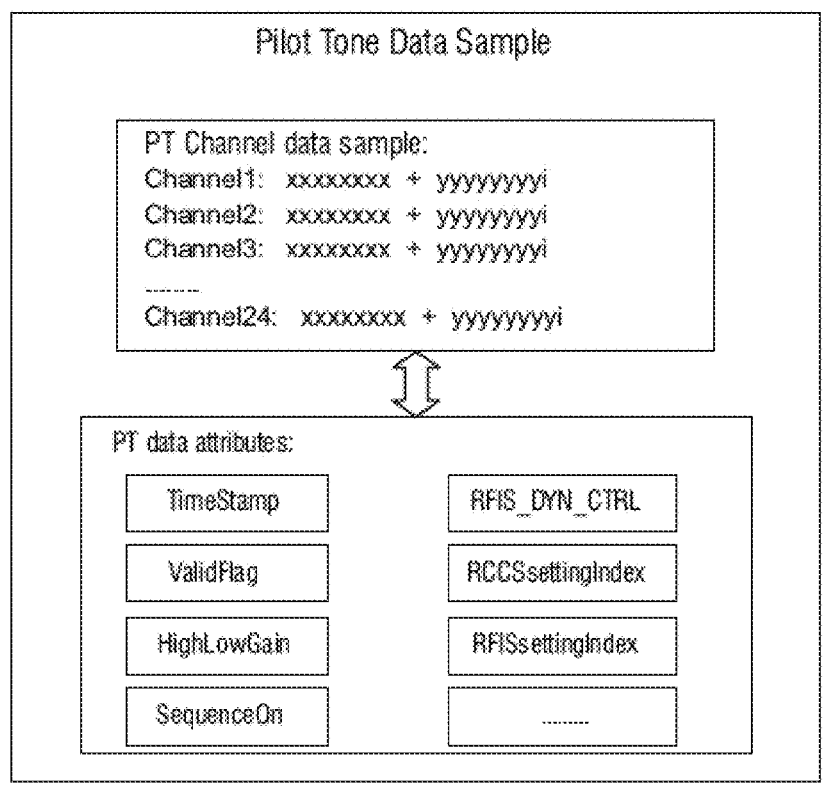
FIG. 4 is a schematic diagram showing the stored data structure of the reference radio frequency signal/pilot tone signal according to an exemplary aspect.

FIG. 4 is a schematic diagram showing the stored data structure of the original reference radio frequency signal/pilot tone signal according to an exemplary aspect.

As shown in FIG. 4, according to one illustrated aspect, the changes of the radio frequency pulses (sequence) can be stored in the buffer in a certain data structure together with the original pilot tone signal data in the time sequence, so that it can be read. For example, the data structure for storing data samples of the original pilot tone signal may comprise multiple channels to sample the original pilot tone signal data (for example, it may comprise 24 channels, represented in the form of complex values), and the more important attributes of the original pilot tone signal data can comprise the time series information.

In addition, according to some aspects, the original reference radio frequency signal/pilot tone signal may be stored in the form of a template.

According to some aspects, the control unit 81 can receive, from the radio frequency transmission controller 31, a control signal in relation to the transmission of the radio frequency pulse sequence by the radio frequency transmitting coil 20, or the information about the control signal in relation to the transmission of the radio frequency pulse sequence can be obtained by switching a transmitting/ receiving switch, or information about the time sequence and control signal, etc. of the radio frequency pulse sequence and/or gradient pulse sequence can be received by the pulse sequence generator 70, or the time series Ts and/or the control signal, etc. in relation to the transmission of the gradient pulse sequence can be received by the gradient unit 40, so as to track the transmission event of the radio frequency pulses, which can help in the analysis of the part in the original pilot tone signal that is affected by the radio frequency interference signal. According to some aspects, the original pilot tone signal of multiple channels can be plotted based on the original pilot tone signal stored in the form of a data structure, and the original pilot tone signal of multiple channels can be analyzed.

According to some aspects, the signal processing device further comprises: a reference radio frequency signal processing unit 86, configured to, in response to a complete repetition time, determine the difference between the original reference radio frequency signal and the fitting signal 852 as the radio frequency interference signal in the repetition time, calculate the radio frequency interference signals in all the repetition times (before the ith), and, in the current repetition times (i+1), determine the difference between the original reference radio frequency signal and the average of the radio frequency interference signals in all the previous repetition times (before the ith) as the reference radio frequency signal in the current repetition time (i+1).

Figure 5:
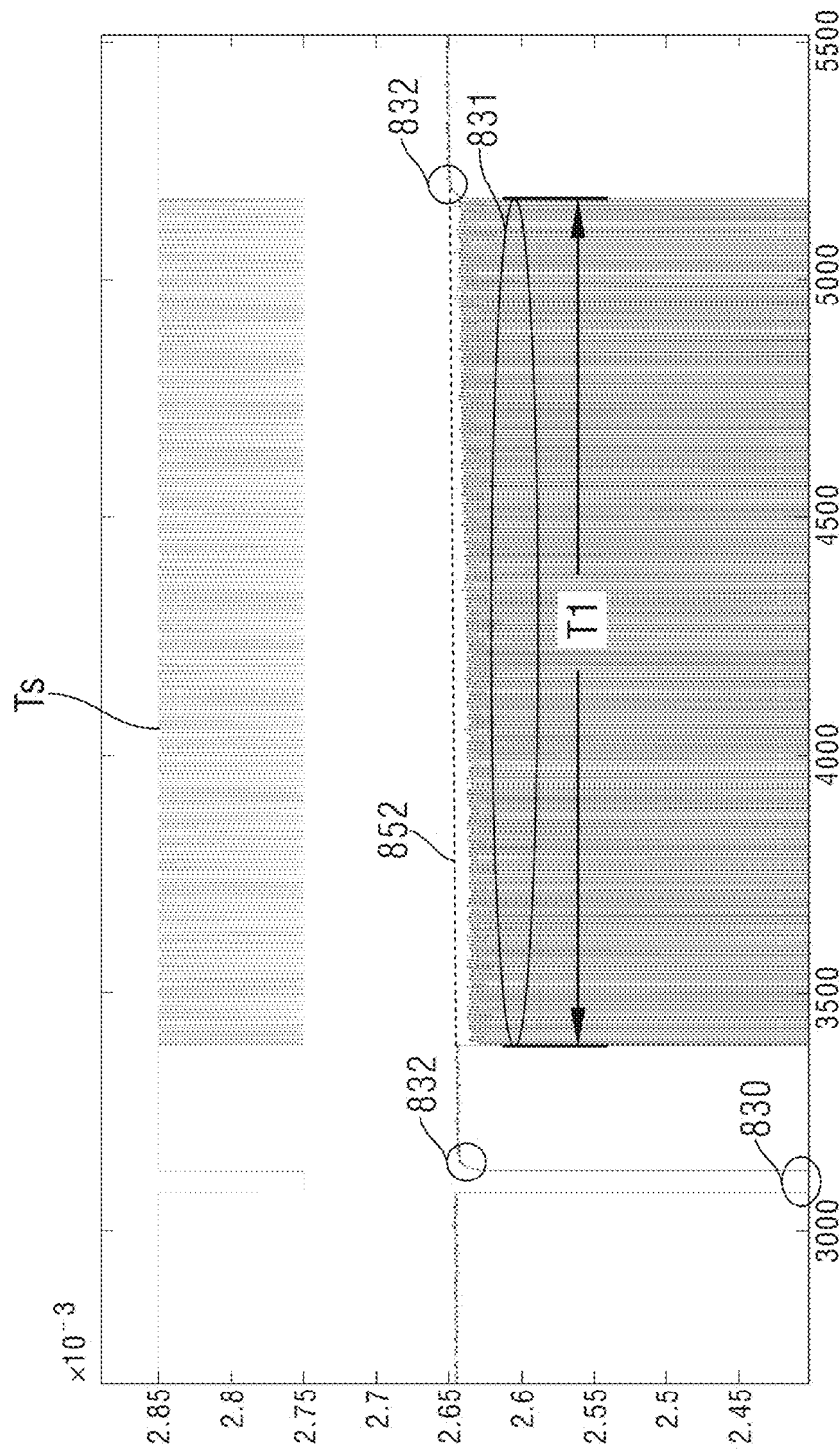
FIG. 5 shows the time series of the radio frequency pulse sequence and reference radio frequency signal/pilot tone signal in one repetition time of the pulse sequence according to an exemplary aspect.

FIG. 5 shows the time series of the radio frequency pulse sequence and pilot tone signal in one repetition time of the pulse sequence according to an exemplary aspect.

As shown in FIG. 5, it can be observed that the time sequence Ts controlling the transmission of the radio frequency pulse sequence is synchronized with the reference original radio frequency signal/pilot tone signal, and, due to the transmission event of the radio frequency pulses (sequence), two echo trains 831 can be observed in the reference original radio frequency signal/pilot tone signal 830 affected by the radio frequency interference signal, of which one is the longer echo train 831, with the length of the echo train expressed by $T_1$. Here, it can be observed that the amplitude of the echo train 831 has obvious sharp changes at the beginning and the end of the transmission event of the radio frequency pulses (sequence). Here, the shorter original reference radio frequency signal/pilot tone signal 830 affected by the radio frequency interference signal may be caused by a $\pi/2$ radio frequency pulse, which is used to make the spinning nucleus in the field $B_0$ flip; while the longer echo train 831 may correspond to a set of continuous $\pi$-radio frequency pulse sequence, for example, used to reverse the phase of the spinning nucleus so that the spinning nucleus are re-aligned to generate the echo signal, which is not limited in this aspect.

Here, the recovery section 832 of the reference radio frequency signal/pilot signal can also be observed to determine the time of the recovery section 832 of the reference radio frequency signal/pilot signal, i.e., the time $T_3$ for the original reference radio frequency signal to return from the interference level to the reference level. The (second) ending point of the echo train 831 can be further determined by the recorded time $T_3$ from the end of the transmission of the radio frequency pulse/radio frequency pulse sequence to the point where the interference level returns to the reference level, in order to obtain a suitable sampling point as the fitting point 851.

For example, according to the above concept, taking the original pilot tone signal comprised in the original reference radio frequency signal as an example, the ith repetition time is selected, and the radio frequency interference signal in the ith repetition time is calculated as follows:

$$\text{Interf\_Sig}_{TR(i)} = PT\_Og\_Sig_{TR(i)} - Fit\_Sig_{TR(i)},$$

where $\text{Interf\_Sig}_{TR(i)}$ stands for the radio frequency interference signal in the ith repetition time, $PT\_Og\_Sig_{TR(i)}$ for the original pilot tone signal in the ith repetition time, and $Fit\_Sig_{TR(i)}$ for the selected fitting signal in the ith repetition time.

Based on determining the interference radio frequency signals in all the repetition times, it is possible to eliminate the impact of radio frequency signals, and restore the reference radio frequency signal $PT\_Sig_{TR(i+1)}$ in the current repetition time, specifically in the following method:

$$PT\_Sig_{TR(i+1)} = PT\_Og\_Sig_{TR(i+1)} - \Sigma_{n=1}^{i}(\text{Interf\_Sign}_{TR(n)})/i$$

i.e., the difference between the original pilot tone signal $$PTog_{Sig_{TR(i+1)}}$$

in the current repetition time and the average of the radio frequency interference signals in all the previous repetition times, to calculate the pilot tone signal $PT\_Sig_{TR(i+1)}$ in the current repetition time. Here, by combining the pilot tone signals $PT\_Sig_{TR(i+1)}$ in all the repetition times, a complete pilot tone signal can be obtained.

This is because, in many sequences, there is a highly repeatable radio frequency pulse sequence in each repetition time, so that each repetition time is the same or similar from a physical point of view. As shown in FIG. 2, the radio frequency interference signal appears periodically. Based on the above assumption, the interference signal can be extracted from the original pilot tone signal in the previous multiple periodic repetition times. The interference signal may be comprised in the deviation signal in the recovery phase/period of the pilot tone signal, and is then eliminated/subtracted from the original pilot tone signal in the currently running repetition time.

Here, the average value of the radio frequency interference signal $$Interf_{Sig_{TR(i)}}$$

of all the previous repetition times in the extraction process of the pilot tone signal $$PT_{Sig_{TR(i+1)}}$$

can reduce the probability of errors introduced by the fitting algorithm from a statistical point of view, especially the impact of abnormal signals, for example, the jump signal occurring in a repetition time. Another advantage is that, in the process of extracting the pilot tone signal $PT_{sig_{TR(i+1)}}$, the average value of the radio frequency interference signal in the previous repetition times can be used in an iterative manner to continuously improve the quality of the reference radio frequency signal/pilot tone signal $PT\_Sig_{TR(i+1)}$ in the subsequent repetition times.

Figure 7:
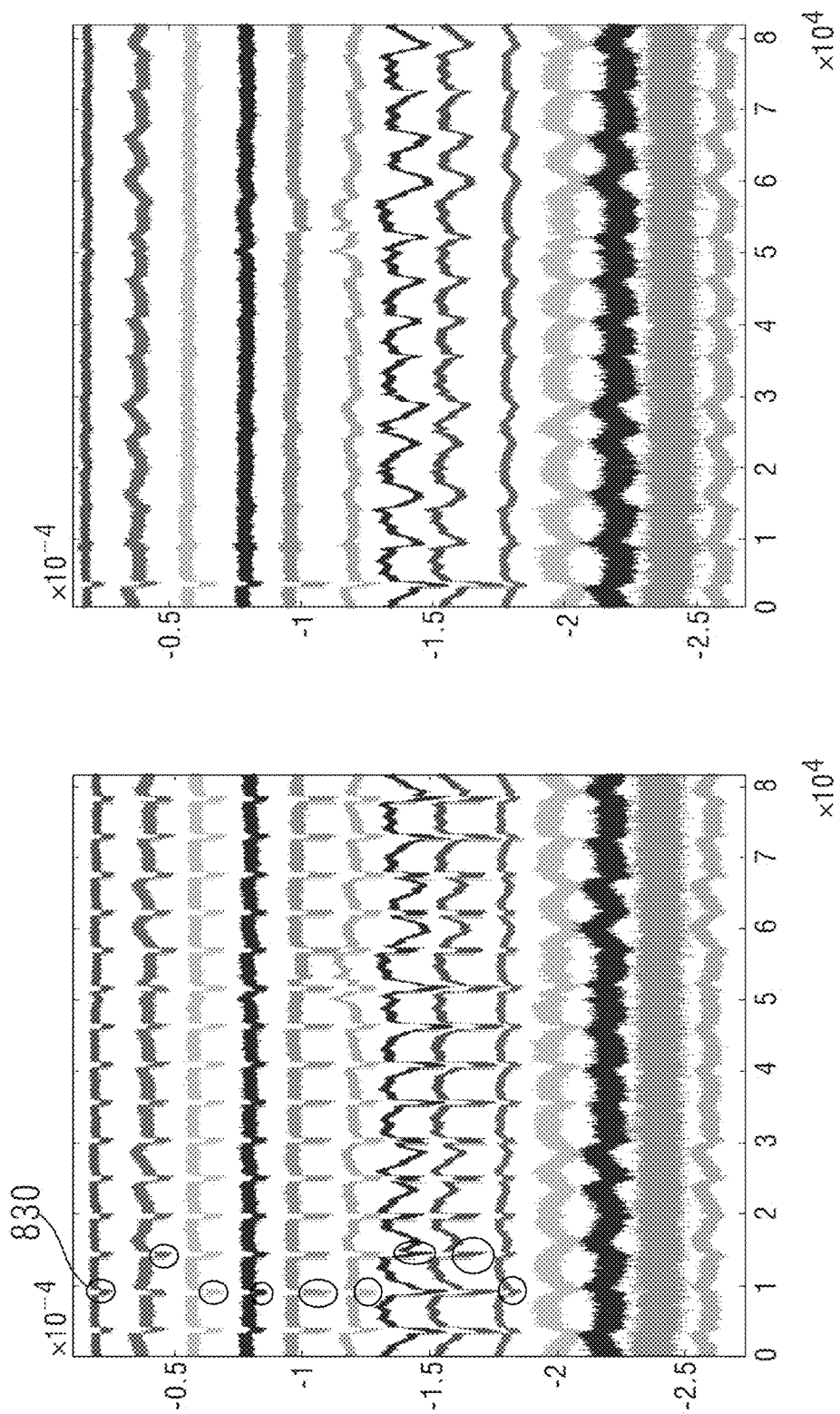
FIG. 7 shows the reference radio frequency signal/pilot tone signal of a multi-channel reference radio frequency signal/pilot tone signal before elimination of the radio frequency interference and after elimination of the radio frequency interference by the signal processing device 80 or method of the present disclosure according to an exemplary aspect.

FIG. 7 shows a schematic diagram of the reference radio frequency signal/pilot tone signal of a multi-channel reference radio frequency signal/pilot tone signal before elimination of the radio frequency interference and after elimination of the radio frequency interference by the signal processing device 80 or method of the present disclosure according to an exemplary aspect.

As shown in FIG. 7, after the signal processing device 80 is used to eliminate the radio frequency interference signal from the multi-channel original reference radio frequency signal/pilot tone signal, it can be clearly observed that, except for the first repetition time where the original reference radio frequency signal/pilot tone signal 830 is affected by the radio frequency interference signal, the radio frequency interference signal in the subsequent repetition times is eliminated from the original reference radio frequency signal/pilot tone signal, and a high-quality multi-channel reference radio frequency signal/pilot tone signal is obtained, so that the multi-channel reference radio frequency signal/pilot tone signal can be combined in subsequent steps.

In order to ensure the quality of the reconstructed pilot tone signal, especially to control the deviation from the part of the pilot tone signal that is not affected by the radio frequency interference signal, the selection and generation of the fitting signal Fit_Sig$_{TR(i)}$ is a key step.

For this, according to some aspects, the fitting signal unit 85 is also configured to calculate the amplitude changes of adjacent sampling points in the domains of the starting point and the first ending point of the echo train 831, select at least one sampling point with the amplitude change within an a priori first threshold as the fitting point 851, and generate, by a fitting algorithm, the fitting signal 852 based on at least one fitting point 851 selected respectively in the domains of the starting point and the first ending point. It should be noted that the amplitude changes of the sampling points in the domains of the starting point and the first ending point can be calculated to determine the part of the original reference radio frequency signal/pilot tone signal that is not affected by the transmission event of the radio frequency pulses, and, based on this part of the fitting signal 852, it can be used to restore the reference radio frequency signal/pilot tone signal related to the echo train pulse.

According to some aspects, the first threshold may be determined based on the amplitude of the part of the reference radio frequency signal/pilot tone signal that is not affected by the transmission event of the radio frequency pulses. Here, the first threshold may be set/determined according to the maximum value of the amplitude change of the part not affected by the transmission event of the radio frequency pulses.

Specifically, the time series of the radio frequency pulse sequence is used to determine the part of the echo train related to the transmitted radio frequency pulse sequence in the pilot tone signal. In the domains of the starting point and ending point of the echo train 831, the changes in the amplitude of each point in the domains are calculated separately. Here, the absolute value of the amplitude change at a certain point at the starting point of the echo train 831 will increase sharply. Therefore, the part on the left side of this point can be determined as the part of the pilot tone signal that is not affected by the radio frequency interference signal. In addition, the absolute value of the amplitude change at a certain point at the ending point of the echo train 831 will return to a relatively small change. Therefore, the part on the right side of this point can be determined as the part of the pilot tone signal that is not affected by the radio frequency interference signal. For this, an a priori threshold can be selected for the amplitude change or deviation of some points in the domains of the starting point and ending point of the echo train 831, to select appropriate points in the domains of the starting point and ending point of the echo train 831 as the points to generate the fitting signal.

As shown in FIG. 5, therefore, according to some aspects, the starting point and ending point of the relevant echo train 831 can be determined in reference to the time series Ts of the control signal related to the transmission of the radio frequency pulse sequence and/or the gradient pulse sequence, or determined by quantitative analysis of some signals, for example, by calculating the amplitude changes of sampling points in some areas or domains of the echo train 831, etc.

According to an illustrated aspect, it is easy to understand that one or some sampling points with the amplitude changes or deviations within the first a priori threshold can be selected in the domain on the left of the starting point of the echo train 831, and one or some sampling points with the amplitude changes or deviations within the a priori first threshold in the domain on the right of the ending point of the echo train 831.

Therefore, according to some aspects, a second ending point of the echo train 831 is determined, and one or some sampling points with the amplitude changes conforming to the a priori first threshold are selected in the domain on the right of the second ending point. For the second ending point of the echo train 831, the recovery section 832 of the reference radio frequency signal/pilot tone signal can be considered, the starting point of the recovery section 832 of the reference radio frequency signal/pilot tone signal can be determined by the ending point of the time series Ts, and the second ending point of the recovery section of the reference radio frequency signal/pilot tone signal is determined by the time $T_3$ for the interference level to return to the reference level. With the help of the determination of the second ending point, a more accurate fitting signal 852 can be obtained on the basis of determining the first ending point.

Therefore, according to some aspects, the identification unit 83 is also configured to determine the point in the time series Ts corresponding to the ending point of the transmission event of the radio frequency pulses as the first ending point, and the domain of the first ending point further comprises a second ending point determined by the time $T_3$ for the interference level in the echo train to return to the reference level; the fitting signal unit 85 is further configured to set the sampling points in the domain of the second ending point, calculate the amplitude changes of the sampling points, and select at least one sampling point with the amplitude change within the first threshold as a fitting point 851.

In addition, if multiple sampling points are selected in the domains of the starting point and ending point of the echo train 831, multiple matching fitting points can be formed at these sampling points, multiple linear fitting signals can be formed, and the average slope can be selected as the fitting signal, which can reduce the statistical error of a single fitting algorithm.

For some short echo trains 831, for example, it is shorter than a selected part of the normal respiratory cycle, being, for example, one third of the normal respiratory cycle. It is only necessary to select at least one suitable point respectively at the starting point and the ending point of the echo train 831, i.e., points with the amplitude change around them within an a priori threshold. Then a linear fitting algorithm is used on the above points to generate a fitting signal 852. After the radio frequency interference is eliminated by the signal processing method, the radio frequency interference can be significantly eliminated, especially in short echo trains, so as to obtain a high-quality pilot tone signal.

However, there are some situations where, for example, a fitting signal is obtained between or in the process of the transmission of the radio frequency pulse sequence in a series of echo trains or special long-time radio frequency pulse sequences, wherein, the special long-time pulse signal may be an inverse pulse (IR) or fat suppression (FS) pulse signal. It is difficult to use the above-mentioned single linear fitting algorithm to obtain a suitable fitting signal to make up for the part of the pilot tone signal that is affected by the radio frequency interference signal.

For this, according to some aspects, the fitting signal unit 85 is also configured to compare the length between the echo train 831 and a selected part of the normal respiratory cycle T, or compare the length between the time interval $T_2$ of adjacent radio frequency pulses transmitted in the echo train 831, as a second threshold, and the time $T_3$ for the original reference radio frequency signal to return from the interference level to the reference level, and determine whether to divide the echo train 831 based on the result of the comparison. Here, the normal respiratory cycle is usually around 3,000-6,000 ms. In one illustrated aspect, the fitting signal unit 85 is also configured to compare length between the echo train 831 and one third of the normal respiratory cycle T.

Here, according to some aspects, the fitting signal unit 85 is also configured to, in response to the length of the echo train being shorter than the selected part of the normal respiratory cycle T, for example, one third of the normal respiratory cycle T, or in response to the time $T_3$ for the original reference radio frequency signal to return from the interference level to the reference level being longer than the second threshold ($T_2$), select at least one first sampling point 851 with the amplitude change within the first threshold in the domain of the starting point of the echo train 831 and at least one second sampling point 851 with the amplitude change within the first threshold in the domain of the first ending point of the echo train 831, and generate the fitting signal 852 by fitting of the first fitting point and the second fitting point by use of a linear fitting algorithm. The above solution corresponds to short echo trains 831. It should be noted that a domain refers to the points in a certain range near or around a selected point.

In addition, according to some aspects, the fitting signal unit 85 is also configured to, in response to the length of the echo train 831 being longer than the selected part of the normal respiratory cycle T, for example, one third of the normal respiratory cycle T, or in response to the time $T_3$ for the original reference radio frequency signal to return from the interference level to the reference level being shorter than the second threshold 12, divide the echo train 831 into a plurality of echo train sections 853. Here, dividing the echo train 831 into a plurality of echo train sections 853 can be used to process some special long-time radio frequency pulse sequences. Special long-time (radio frequency) pulse signals may be inverse pulse (IR) or fat suppression (FS) pulse signals. According to some preferred aspects, in the comparison of the length between the echo train 831 and the selected part of the normal respiratory cycle T, ¼ to ½ of the normal respiratory cycle T may be selected. In an illustrated aspect, it is preferable to select one third of the normal respiratory cycle T in the comparison between the two.

In view of this, according to some aspects, the fitting signal unit 85 is also configured to select at least one fitting point 851 with the amplitude change within the first a priori threshold respectively in the domains of the starting point and the first ending point of each of the echo train sections 853, to form a plurality of fitting points 851, and fit the plurality of fitting points 851 by a nonlinear fitting algorithm to generate the fitting signal 852. Obviously, the fitting signal 852 may be generated one by one corresponding to the repetition time.

In addition, according to some optional aspects, the fitting signal unit 85 is also configured to select at least one sampling point with the amplitude change within the first a priori threshold respectively in the domains of the starting point and the first ending point of each of the echo train sections 853 as fitting points 851, to form a plurality of fitting points 851, and fit adjacent fitting points by use of linear fitting to generate a poly-segment fitting signal 852.

Figure 6:
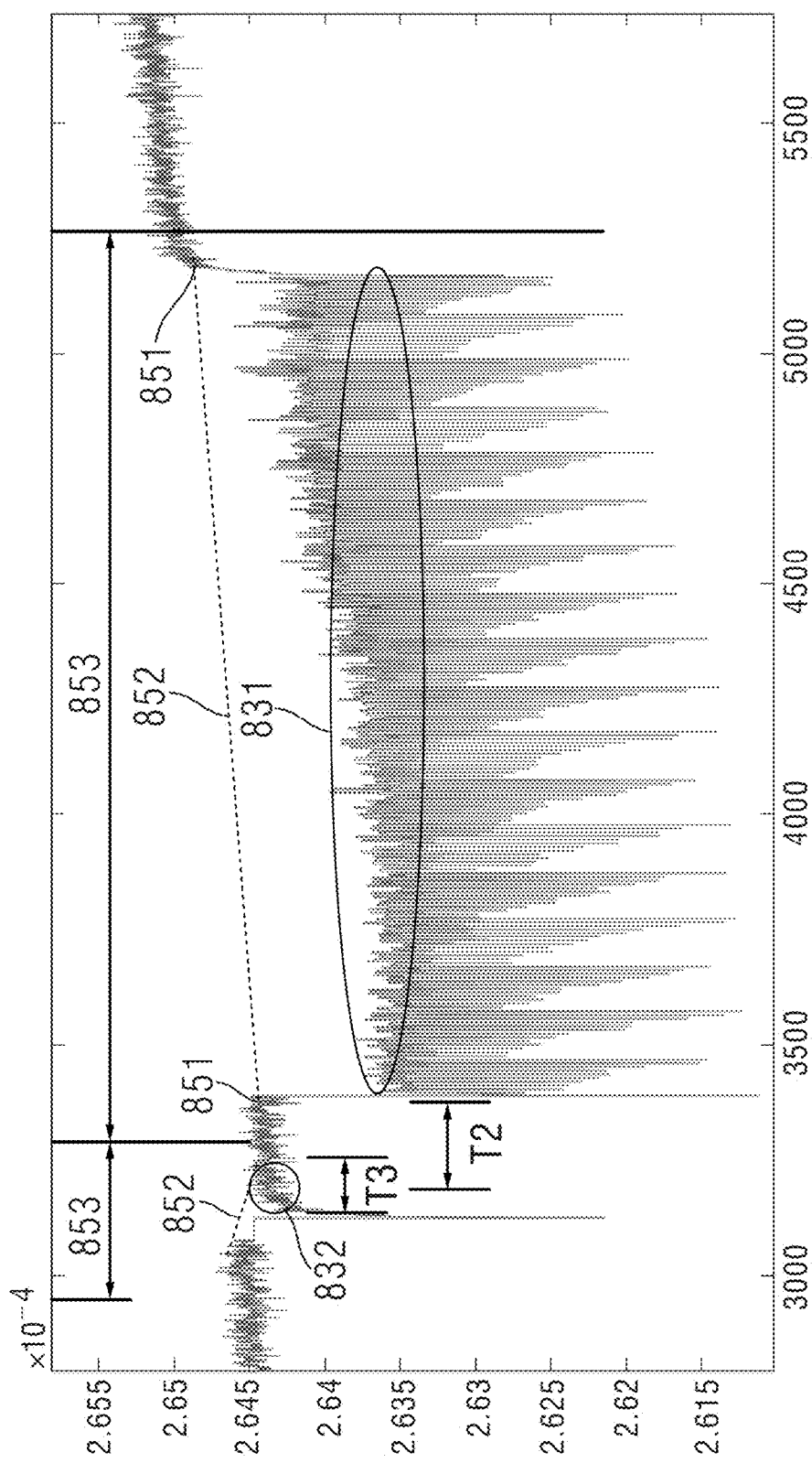
FIG. 6 shows the processing of the radio frequency pulse sequence and reference radio frequency signal/pilot tone signal in one repetition time of the magnetic resonance signal divided into a plurality of echo train sections 853 according to an exemplary aspect.

In a specifically illustrated situation, the time interval between the transmission of adjacent radio frequency pulses in the echo train 831 will be too long, and, as shown in FIG. 6, part of the echo train 831 in the middle is not affected by the transmission event of adjacent radio frequency pulses, which leads to the inaccurate fitting of the fitting signal 852 obtained based on the sampling points selected at the starting point and the first ending point of the echo train 831 as the fitting points 851, producing considerable error and potentially introducing a greater probability of deviation and error.

FIG. 6 shows the processing of the radio frequency pulse sequence and reference radio frequency signal/pilot tone signal in one repetition time of the magnetic resonance signal divided into a plurality of echo train sections 853 according to an exemplary aspect.

As shown in FIG. 6, the specific method for dividing the echo train 831 into a plurality of echo train sections 853 may be, firstly determining the starting point and (the first) ending point of the echo train 831 through recording the time series of the transmission of the radio frequency pulses, taking the time $T_3$ for the original reference radio frequency signal to return from the interference level to the reference level into consideration at the ending point (to obtain the second ending point), and then considering the situations where the echo train 831 is longer than the selected part of the normal respiratory cycle T and where a linear fitting signal 852 is distorted because the transmission interval between adjacent radio frequency pulses in the echo train 831 is too long, making it necessary to divide the echo train 831 into a plurality of echo train sections 853, whereby it is possible to process situations including the returning/reflective signal of the original reference radio frequency signal as a result of some special long-time (radio frequency) pulse sequences.

For this, where the echo train 831 is longer than the selected part of the normal respiratory cycle T, for example, one third of the normal respiratory cycle T, even dividing, or dividing based on the length of one third of the normal respiratory cycle T as the dividing unit, can be used to divide the echo train 831 from the starting point to the ending pointing into a plurality of echo train sections 853. Here, where the transmission interval $T_2$ between adjacent radio frequency pulses in the echo train 831 is longer than the time $T_3$ for the original radio frequency signal to return from the interference level to the reference level, i.e., where $T_2 > T_3$, the starting point and the first ending point of the echo train 831 can be determined, as well as the starting point and ending point (end) of the interval between adjacent radio frequency pulses, and the echo train 831 is divided into a plurality of echo train sections 853 based on the sections divided by the above multiple pairs of starting and ending points (ends). Then, the fitting signal unit 85 is further configured to select at least one sampling point with the amplitude change within the first threshold respectively in the domains of each set of the starting point and the first ending point of the generated echo train sections 853 as fitting points 851, to form a plurality of fitting points 851, and fit the plurality of fitting points 851 by use of a nonlinear fitting algorithm to generate the fitting signal 852, or fitting adjacent fitting points 851 by use of a linear fitting algorithm to form a poly-segment fitting signal 852. The method for obtaining the fitting signal 852 has been described in several aspects above and will not be repeated here.

According to some aspects, in order to monitor and track the reference radio frequency signal (for example, a pilot tone signal) in real time and to align it with the time series of the radio frequency pulse sequence and/or gradient pulse sequence in time sequence, and to determine the start and end of the radio frequency pulse sequence and/or gradient pulse sequence and determine a complete repetition time, the identification unit 83 is configured to track the changes in the time series Ts of the control signal in real time and to detect, from the time series Ts, the start of the transmission of the radio frequency pulses.

For this, according to some aspects, the identification unit 83 is configured to, in response to detecting, from the time series, the start of the transmission event of the radio frequency pulses (sequence), and the identification unit 83 being further configured to read the original reference radio frequency signal into a buffer 84, track the change of the time series, and decide whether a repetition time has ended. Here, the buffer 84 can set a buffer area for the time series data related to the transmission of the radio frequency pulse sequence, the gradient pulse sequence and the original reference radio frequency signal, so as to track the time series and determine a complete repetition time.

Another aspect of the present disclosure provides a signal processing method, which, based on the correlation between the transmission of the radio frequency pulse sequence, transmission of the gradient sequence pulse sequence, and dynamic tuning/demodulation of the related radio frequency transmitting coil, including the local coil, and the original reference radio frequency signal, determines the part of the original reference radio frequency signal not affected by the transmission event of the above radio frequency pulses (sequence) by use of the above correlation of the generation of the radio frequency interference signal and information of the time series reflecting the time sequence of the above event, and reconstructs the reference radio frequency signal by use of the information of the ending point and the starting point of the above part not affected, to eliminate the impact of radio frequency interference signals. The signal processing method is described in detail below with reference to the flowchart of the method.

Figure 8:
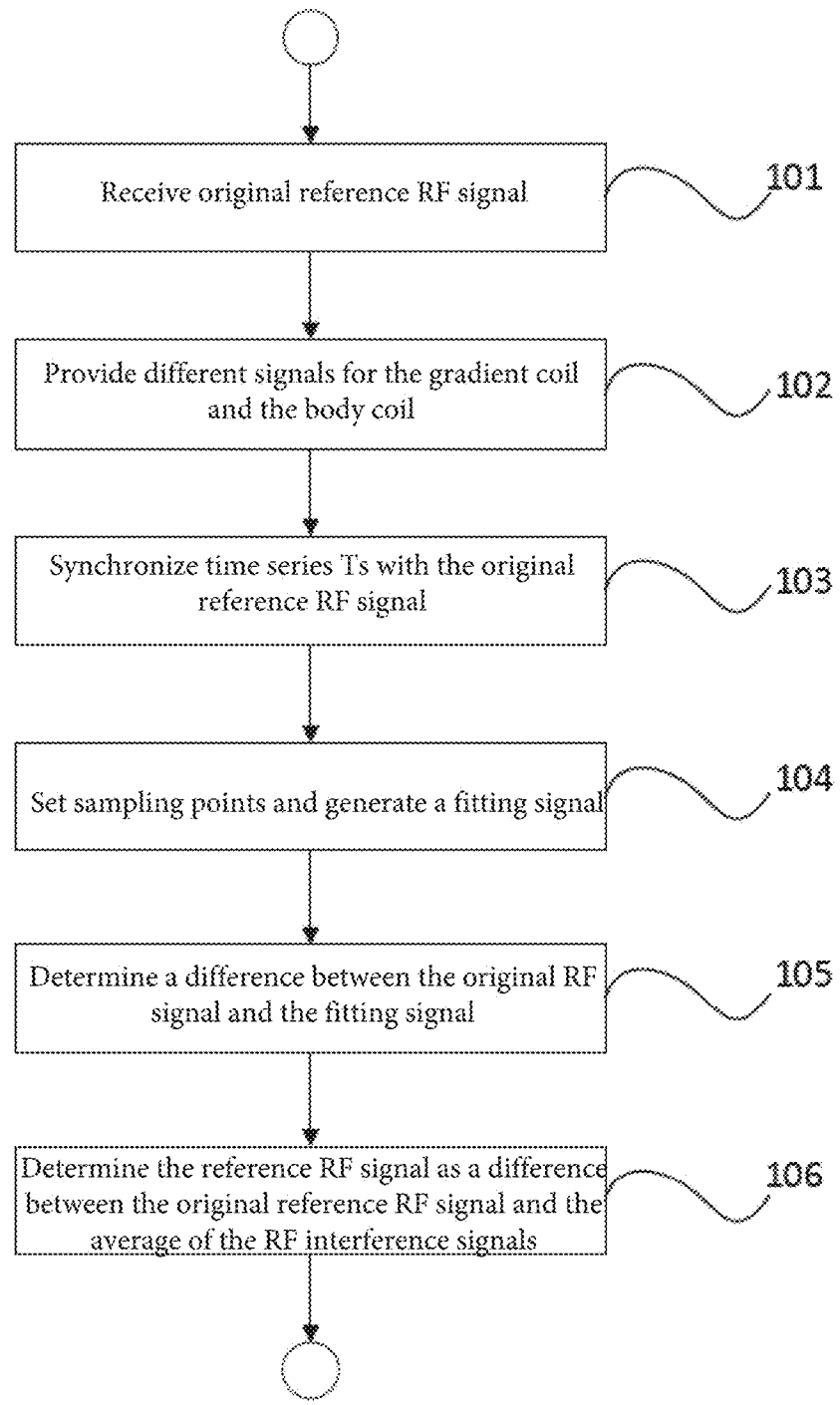
FIG. 8 is a flowchart of the method for determining the radio frequency interference signal and eliminating the radio frequency interference signal from the original reference radio frequency signal/pilot tone signal in the signal processing method according to an exemplary aspect.

FIG. 8 is a flowchart of the method for determining the radio frequency interference signal and eliminating the radio frequency interference signal from the original reference radio frequency signal/pilot tone signal in the signal processing method according to an exemplary aspect. The method, through determining the time series Ts of the transmission of radio frequency pulses, restores the reference radio frequency signal by use of the part of the reference radio frequency signal that is not affected by the radio frequency interference signal.

In step 101, the original reference radio frequency signal associated with physiological signal of the mechanical movement of the measured object is received from a receiving antenna group.

According to some illustrated aspects, the original reference radio frequency signal may be an original pilot tone signal, guide signal, pilot signal, etc.

The reference radio frequency signal, including a pilot tone signal, is defined in the field of magnetic resonance imaging as, through transmitting a signal modulated to a high frequency/radio frequency to the local anatomical position of a measured object or patient under the excitation of a non-uniform magnetic field, the magnetic field signal generated by the precession of the aligned nuclear spins at the Larmor frequency, with the modulated high frequency/radio frequency signal received by a receiving antenna, which reflects the physiological signals related to the movement of the mechanical systems of the measured object or patient, such as heartbeat, respiration and other periodic mechanical movements, and is used to track physiological signals such as heartbeat, respiratory cycle, etc. in the process of magnetic resonance imaging. The reference radio frequency signal may include: a pilot tone signal, a pilot signal, etc., may have a suitable high frequency/radio frequency, etc., and may be modulated to the Larmor frequency or a range near the Larmor frequency in some illustrated aspects. In addition, the original reference radio frequency signal associated with the reference radio frequency signal can be defined as a signal that is mixed and superimposed with radio frequency interference signals.

In step 102, the time series Ts of the control signal associated with the transmission event of the radio frequency pulses (sequence) is received.

According to some illustrated aspects, the transmission event of the radio frequency pulses (sequence) may comprise: radio frequency pulses such as those of the field $B_1$ generated by the body coil 14, a radio frequency pulse sequence transmitted by the radio frequency transmitting coil 20, including the local coil 22, to the measured object/patient, which is used to generate a non-uniform field $B_1$, a gradient pulse sequence sent by the gradient coil, which provides spatial encoding for the radio frequency pulse sequence through a gradient magnetic field, or dynamic tuning/demodulation by the radio frequency transmitting coil 20, for example, the local coil 22, etc.

In addition, it is possible to receive, from the radio frequency transmission controller 31, a control signal in relation to the transmission of the radio frequency pulse sequence by the radio frequency transmitting coil 20, or the information about the control signal in relation to the transmission of the radio frequency pulse sequence can be obtained by switching a transmitting/receiving switch, or information about the time sequence and control signal, etc. of the radio frequency pulse sequence and/or gradient pulse sequence can be received by the pulse sequence generator 70, or the time series Ts and/or the control signal, etc. in relation to the transmission of the gradient pulse sequence can be received by the gradient unit 40.

In step 103, the time series Ts is synchronized with the original reference radio frequency signal, and the echo train 831 in the original reference radio frequency signal in a repetition time of the pulse sequence is determined, wherein the echo train 831 corresponds to the part of the time series Ts of the control signal associated with the transmission event of the radio frequency pulses (sequence) in time sequence.

In step 104, the sampling points in the domains of the starting point and a first ending point of the echo train 831 are set, and a fitting signal 852 is generated based on the sampling points to eliminate the radio frequency interference signal resulted from the transmission event of the radio frequency pulses, wherein the point in the time series Ts corresponding to the ending point of the transmission event of the radio frequency pulses is determined as the first ending point.

According to some aspects, in response to receiving a complete repetition time, the sampling points in the domains of the starting point and the first ending point of the echo train 831 can be set. Here, the amplitude changes of adjacent sampling points in the domains of the starting point and the first ending point are calculated, and at least one sampling point with the amplitude change within an a priori first threshold is selected respectively in the domains of the starting point and the first ending point as fitting points 851.

According to some aspects, in order to improve the accuracy in the generation of the fitting signal 852, the domain of the first ending point further comprises a second ending point determined by the time when the interference level in the echo train 831 returns to the reference level. The second ending point is roughly located in the recovery section 832 of the reference radio frequency signal/pilot tone signal.

According to some aspects, the sampling points in the domain of the second ending point are set, the amplitude changes of the sampling points are calculated, and at least one sampling point with the amplitude change within the first threshold is selected as a fitting point 851.

According to some aspects, the first threshold may be determined based on the amplitude of the part of the reference radio frequency signal/pilot tone signal that is not affected by the transmission event of the radio frequency pulses, and the first threshold may be set according to the maximum change of the amplitude.

In step 105, the difference between the original reference radio frequency signal and the fitting signal 852 is determined as the radio frequency interference signal in a repetition time.

According to some aspects, in response to obtaining a complete repetition time, the difference between the original reference radio frequency signal and the fitting signal 852 can be determined as the radio frequency interference signal in a repetition time.

In step 106, in the current repetition time, the difference between the original reference radio frequency signal and the average of the radio frequency interference signals in all the previous repetition times is determined as the reference radio frequency signal in the current repetition time.

In order to, taking the repetition time as the unit, track the changes of the time series Ts related to the radio frequency pulse sequence, detect the transmission event of the radio frequency pulse sequence, and associate the above transmission event of the radio frequency pulse sequence with the pilot tone signal, the signal processing method of this illustrated aspect further comprises a method for identifying the echo train in the pilot tone signal that is associated with the transmission event of the radio frequency pulses in a repetition time based on synchronization of the time series Ts between the radio frequency pulse sequence and the pilot tone signal.

Figure 9:
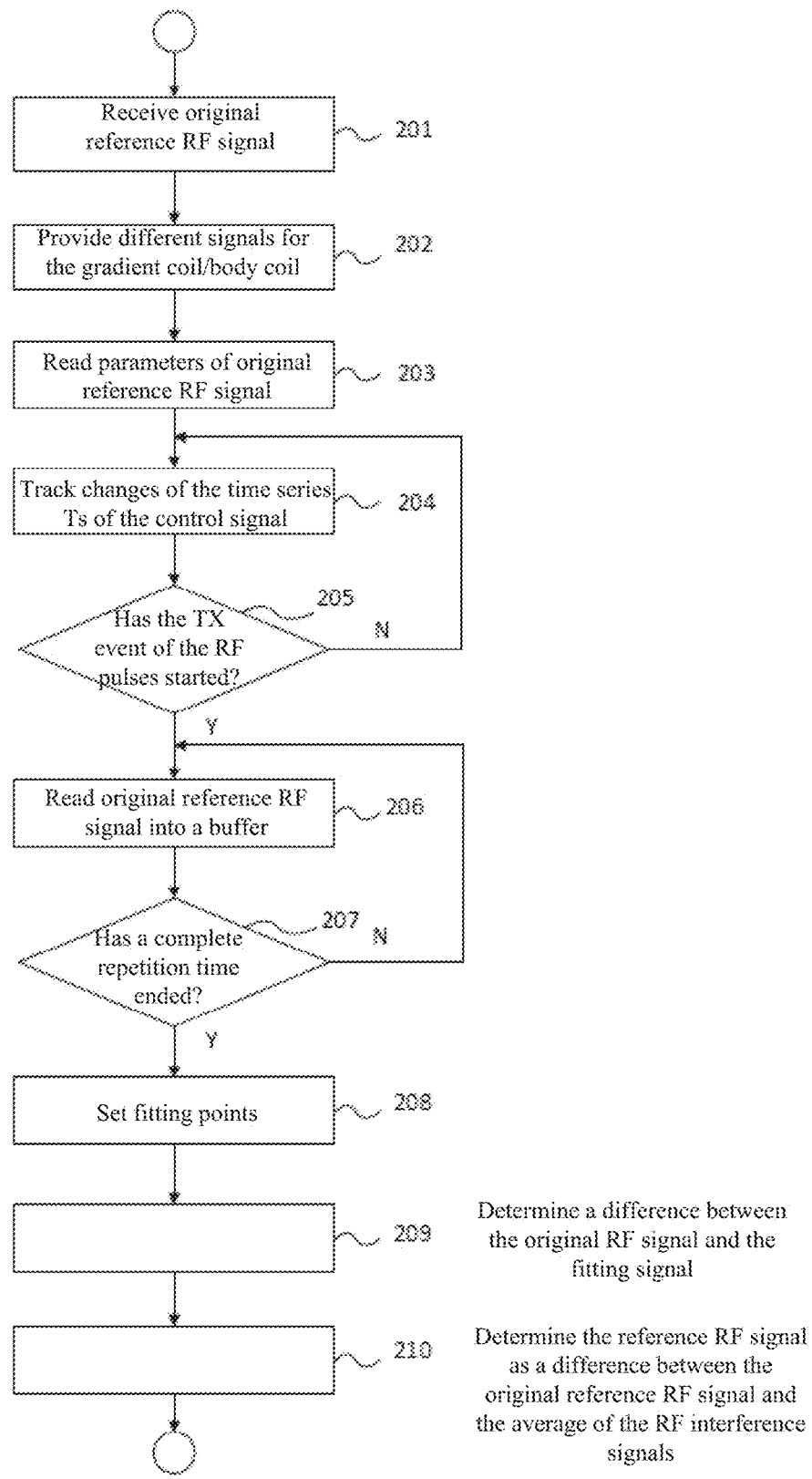
FIG. 9 is a flowchart of the method for determining the echo train of the original reference radio frequency signal/pilot tone signal in a repetition time in the signal processing method according to an exemplary aspect.

FIG. 9 is a flowchart of the method for determining the echo train 831 of the original reference radio frequency signal/pilot tone signal in a repetition time in the signal processing method according to an exemplary aspect.

In the drawing, steps 201 and 202 can respectively correspond to steps 101 and 102 described based on FIG. 1, and will not be repeated here.

In step 203, the parameters of the original reference radio frequency signal are read, which include at least the repetition time.

Here, the original reference radio frequency signal is stored in a data structure by multiple channels so that the parameters of the original reference radio frequency signal can be read. The repetition time is an important parameter. The original reference radio frequency signal is regular and reproducible in each repetition time. This property can be used to eliminate the impact of the radio frequency interference signal related to the transmission event of the radio frequency pulse sequence in the original reference radio frequency signal. In addition, the original reference radio frequency signal/pilot tone signal may be stored in the form of a template by multiple channels.

In step 204, the changes of the time series Ts of the control signal used to control the transmission of the radio frequency pulses are tracked.

In step 205, it is decided whether the transmission event of the radio frequency pulses has started.

If the decision is no, the process returns to step 204 to continue tracking the changes of the time series Ts of the control signal associated with the transmission event of the radio frequency pulses.

In step 206, in response to determining the start of the transmission event of the radio frequency pulses, the original reference radio frequency signal is read into a buffer, the echo train 831 of the original reference radio frequency signal in the repetition time is determined, and the change of the time series Ts is continued to be tracked.

Wherein, the echo train 831 corresponds to the part associated with the transmission event of the radio frequency pulses in time sequence.

In step 207, it is decided whether a complete repetition time has ended.

If the decision is no, the process will return to step 206 where the original reference radio frequency signal is continued to be read into the buffer and the change of the time series Ts is continued to be tracked.

In step 208, in response to obtaining a complete repetition time, the sampling points in the domains of the starting point and the ending point of the echo train 831 conforming to the a priori threshold are set as fitting points 851, and a fitting signal 852 is generated based on the fitting points 851 at the two ends to eliminate the radio frequency interference signal resulted from the transmission event of the radio frequency pulses.

Wherein, steps 209 and 210 correspond to steps 105 and 106 described based on the drawings, and will not be repeated here.

In addition, in order to, taking the repetition time as the unit, associate the detected transmission event of the radio frequency pulse sequence with the pilot tone signal, the signal processing method of the illustrated aspect further comprises the method for generating the fitting signal, which can generate the fitting signal based on the length of the echo train 831 by use of an appropriate fitting algorithm, and use it to determine the radio frequency interference signal and eliminate the impact of the radio frequency interference signal.

Figure 10:
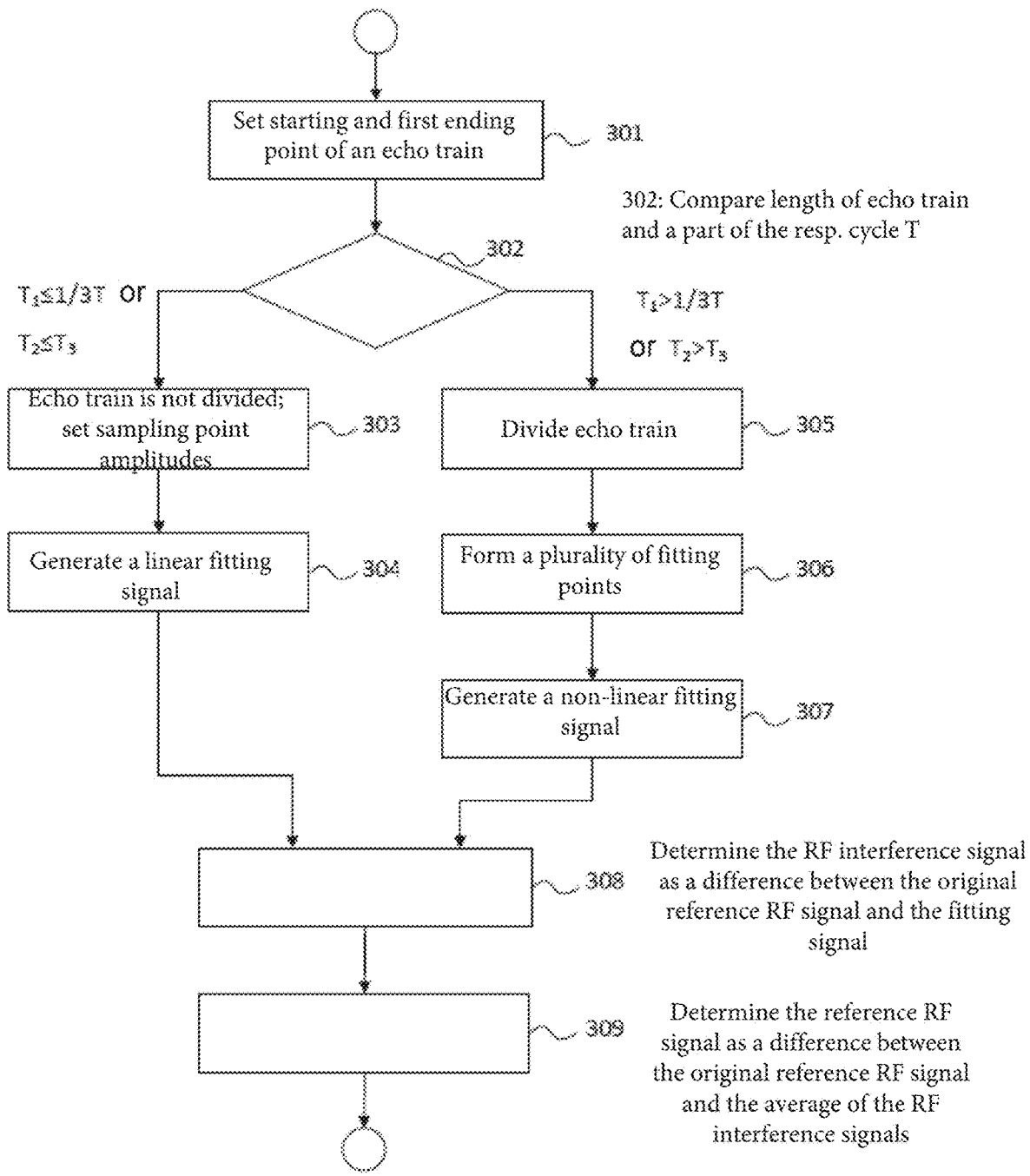
FIG. 10 is a flowchart of the method for generating a fitting signal used to eliminate the radio frequency interference signal in the original reference radio frequency signal/pilot tone signal in the signal processing method according to an exemplary aspect.

FIG. 10 is a flowchart of the method for generating a fitting signal used to eliminate the radio frequency interference signal in the original reference radio frequency signal/pilot tone signal in the signal processing method according to an exemplary aspect.

In step 301, in response to receiving a complete repetition time, the sampling points in the domains of the starting point and a first ending point of the echo train 831 are set.

Here, at least one sampling point with the amplitude change within an a priori first threshold may be taken as the fitting point 851. Here, in order to improve the accuracy in the generation of the fitting signal 852, the domain of the first ending point further comprises a second ending point determined by the time $T_3$ when the interference level in the echo train 831 returns to the reference level. The second ending point is roughly located in the recovery section 832 of the reference radio frequency signal/pilot tone signal. The sampling points in the domain of the second ending point are set, the amplitude changes of the sampling points are calculated, and at least one sampling point with the amplitude change within the first threshold is selected as the fitting point 851. Selecting the fitting point 851 in the recovery section 832 of the reference radio frequency signal/pilot tone signal or on its right side can improve the accuracy of the fitting signal 852, so as to better determine the radio frequency interference signal and extract a high-quality reference radio frequency signal/pilot tone signal.

In step 302, the length is compared between the echo train 831 and a selected part of the normal respiratory cycle T, or the length is compared between the time interval $T_2$ of adjacent radio frequency pulses (sequence) transmitted in the echo train 831, as a second threshold, and the time $T_3$ for the original reference radio frequency signal to return from the interference level to the reference level, and it is decided whether to divide the echo train 831 based on the result of the comparison.

Wherein, the normal respiratory cycle T ranges between 3,000 ms and 6,000 ms, and can be set to 4, 500 ms, one third of which is 1,500 ms. That is, in an illustrated aspect, the length T of the echo train and one third of the normal respiratory cycle T are compared.

In step 303, in response to the echo train being shorter than one third of the normal respiratory cycle T, i.e., 1,500 ms, or in response to the time $T_3$ for the original reference radio frequency signal to return from the interference level to the reference level being longer than the second threshold, the echo train 831 is not divided, the amplitudes of the sampling points set in the domains of the starting point and the first ending point of the echo train 831 are calculated, and the amplitude changes of adjacent sampling points are calculated.

In step 304, the fitting signal 852 is generated by use of a linear fitting algorithm based on at least one sampling point with the amplitude change within an a priori first threshold selected in the domains of the starting point and the first ending point as fitting points 851.

In step 305, in response to the echo train 831 being longer than one third of the normal respiratory cycle T, i.e., 1,500 ms, or in response to the time $T_3$ for the original reference radio frequency signal to return from the interference level to the reference level being shorter than the second threshold, the echo train 831 is divided into a plurality of echo train sections 853.

In step 306, in response to dividing the echo train 831 into a plurality of echo train sections 853, at least one sampling point is selected respectively in the domains of each pair of the starting point and the first ending point of the echo train sections 853 as fitting points 851, to form a plurality of fitting points 851.

Wherein, the sampling points with the amplitude change conforming to the a priori first threshold selected in the domains of each pair of the starting point and the ending point of the echo train sections 853 may be taken as fitting points 851.

In step 307, in response to the selection of a plurality of fitting points 851, non-linear fitting is used on the plurality of fitting points 851 to form a fitting curve as the fitting signal, or linear fitting is used on adjacent fitting points 851 to form a poly-segment fitting signal.

The above steps can solve the problem that the time interval between the transmission of adjacent radio frequency pulses in the echo train 831 will be too long, which leads to a greater probability of deviation and error introduced to the fitting signal obtained based on the sampling points selected at the starting point and the first ending point of the echo train 831 as the fitting points.

At the same time, the above steps can be used to handle some situations where, for example, a fitting signal is obtained between or in the process of the transmission of the radio frequency pulse sequence in a series of echo trains or special long-time radio frequency pulse sequences, wherein, the special long-time pulse signal may be an inverse pulse (IR) or fat suppression (FS) pulse signal.

In step 308, in response to the generation of the fitting signal 852, the difference between the original reference radio frequency signal and the fitting signal 852 is determined as the radio frequency interference signal in a repetition time.

In step 309, in the current repetition time, the difference between the original reference radio frequency signal and the average of the radio frequency interference signals in all the previous repetition times is determined as the reference radio frequency signal in the current repetition time.

The above signal processing method can be applied to processing abnormal interference in some magnetic resonance sequences, such as the Trufi sequence or the Haste sequence.

According to one aspect of the present disclosure, an electronic device is also provided, comprising: a processor; a memory storing a program, wherein the program comprises instructions that, when executed by the processor, causes the controller to execute the signal processing method as described above.

According to another aspect of the present disclosure, a computer-readable storage medium storing a program is also provided, wherein the program comprises instructions that, when executed by the processor of the electronic device, cause the electronic device to execute the signal processing method as described above.

Figure 11:
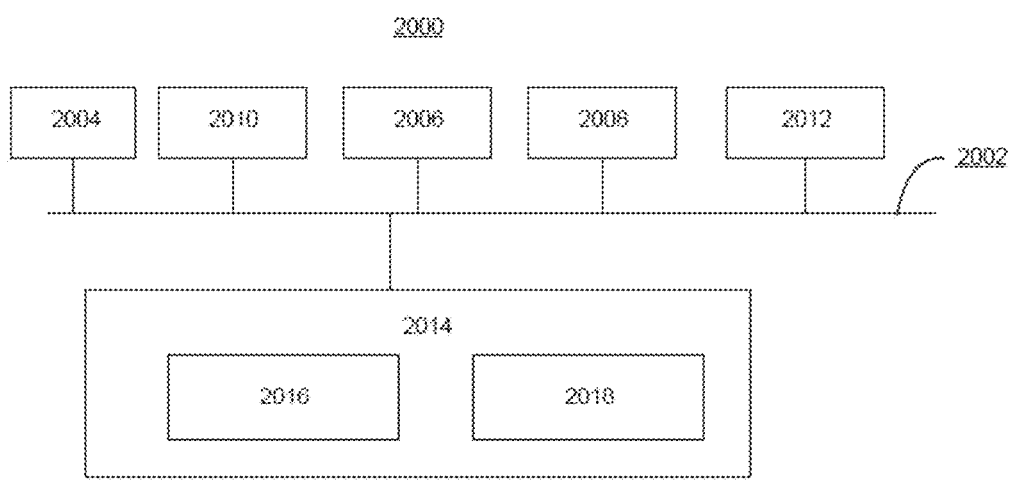
FIG. 11 is a structural block diagram showing an exemplary computing device that can be applied to the exemplary aspects.

With reference to FIG. 11, the computing device 2000 will be described, which is an example of the electronic device that may be applied to all the aspects of the present disclosure. The computing device 2000 can be any machine configured to perform processing and/or computation, and can be, but is not limited to, a workstation, server, desktop computer, laptop computer, tablet computer, personal digital assistant, robot, smart phone, vehicle-mounted computer, or any combination thereof. The above-mentioned intent recognition method can be implemented in whole or at least in part by the computing device 2000 or similar devices or systems.

The computing device 2000 may comprise (possibly via one or more interfaces) components connected to or in communication with a bus 2002. For example, the computing device 2000 may comprise a bus 2002, one or more processors 2004, one or more input devices 2006, and one or more output devices 2008. The one or more processors 2004 may be any type of processors, and may comprise, but are not limited to, one or more general-purpose processors and/or one or more special-purpose processors (for example, special processing chips). The input device 2006 may be any type of devices that can input information to the computing device 2000, and may comprise, but is not limited to, a mouse, a keyboard, a touch screen, a microphone, and/or a remote control. The output device 2008 may be any type of devices that can present information, and may comprise, but is not limited to, a display, a speaker, a video/audio output terminal, a vibrator, and/or a printer. The computing device 2000 may also comprise a non-transient storage device 2010 or be connected to a non-transient storage device 2010, and the non-transient storage device may be any storage device that is non-transient and can implement data storage, and may comprise, but is not limited to, disk drives, optical storage devices, solid-state memory, floppy disks, flexible disks, hard disks, tapes or any other magnetic media, optical disks or any other optical media, ROM (read only memory), RAM (random access memory), cache memory and/or any other memory chips or cartridges, and/or any other medium from which a computer can read data, instructions and/or code. The non-transient storage device 2010 can be detached from the interface. The non-transitory storage device 2010 may have data/programs (including instructions)/code for implementing the above method and steps. The computing device 2000 may further comprise a communication device 2012. The communication device 2012 may be any type of devices or systems that enables communication with an external device and/or with a network, and may comprise, but is not limited to, a modem, a network card, an infrared communication device, a wireless communication device, and/or a chipset, such as a Bluetooth™ device, a 1302.11 device, a WiFi device, a WiMax device, a cellular communication device and/or similar.

The computing device 2000 may further comprise a working memory 2014, which may be any type of work memory that can store programs (including instructions) and/or data useful for the work of the processor 2004, and may comprise, but is not limited to, random access memory and/or read-only memory devices.

The software elements (programs) may be located in the working memory 2014, including but not limited to an operating system 2016, one or more application programs 2018, drivers and/or other data and code. Instructions for executing the above method and steps may be comprised in one or more application programs 2018, and the above intent recognition method may be implemented by reading and executing instructions of one or more application programs 2018 by the processor 2004. More specifically, in the above intent recognition method, steps 101 to 106, steps 201 to 210, and steps 301 to 309 may be implemented, for example, through executing, by the processor 2004, the application program 2018 with instructions of steps 101 to 106, steps 201 to 210, and steps 301 to 309. In addition, other steps in the above intent recognition method may be implemented, for example, through executing, by the processor 2004, the application program 2018 with instructions for executing the corresponding steps. The executable code or source code of the instructions of the software element (program) may be stored in a non-transient computer-readable storage medium (such as the aforementioned storage device 2010), and may be stored into the working memory 2014 (and possibly compiled and/or installed) during execution. The executable code or source code of the instructions of the software element (program) may also be downloaded from a remote location.

It should also be understood that various modifications can be made according to specific requirements. For example, customized hardware may also be used, and/or hardware, software, firmware, middleware, microcode, hardware description language, or any combination thereof may be used to implement specific elements. For example, some or all of the disclosed method and device may be implemented by programming, based on the logic and algorithm of the present disclosure, hardware (for example, programmable logic circuits including field programmable gate arrays (FPGAs) and/or programmable logic arrays (PLAs)) by use of an assembly language or a hardware programming language (such as VERILOG, VHDL, and C++).

It should also be understood that the aforementioned method may be implemented in a server-client mode. For example, the client can receive data entered by the user and send the data to the server. The client can also receive the data entered by the user, perform part of the processing in the above method, and send the data obtained from the processing to the server. The server can receive data from the client, execute the above method or another part of the above method, and return the execution result to the client. The client can receive the execution result of the method from the server and, for example, can present it to the user through an output device.

It should also be understood that the components of the computing device 2000 can be distributed on a network. For example, one processor may be used to perform some processing, while another processor far away from the one processor may perform other processing at the same time. Other components of the computing device 2000 can be similarly distributed. In this way, the computing device 2000 can be construed as a distributed computing system that performs processing in multiple locations.

Although the aspects or examples of the present disclosure have been described with reference to the accompanying drawings, it should be understood that the above-mentioned methods, systems, and devices are merely exemplary aspects or examples, and the scope of the present disclosure is not limited by these aspects or examples, but is only limited by the authorized claims and their equivalent scope. Various elements in the aspects or examples may be omitted or replaced by equivalent elements. In addition, the steps may be performed in an order different from that described in this disclosure. Further, various elements in the aspects or examples may be combined in various ways. It is important that as technology evolves, many elements described herein may be replaced by equivalent elements appearing after this disclosure.

The invention claimed is:

1. A signal processing method for determining and eliminating radio frequency (RF) interference signals during a process where magnetic resonance imaging (MRI), device collects an original reference RF signal associated with mechanical movement of a measured object, the method comprising:
receiving the original reference radio frequency signal from a receiving antenna group;
receiving a time series of a control signal associated with a transmission event of RF pulses identified with an RF pulse sequence in a time sequence;
synchronizing the time series with the original reference RF signal, and determining an echo train in the original reference RF signal in a repetition time of the RF pulse sequence, wherein the echo train corresponds to a part of the time series associated with the transmission event of the RF pulses in the time sequence; and setting sampling points in domains of a starting point and a first ending point of the echo train, and generating a fitting signal based on the sampling points to eliminate the RF interference signal in the original reference RF signal resulting from the transmission event of the RF pulses during an image acquisition process in which magnetic resonance signals are acquired via the MRI device using the original reference RF signal, wherein a point in the time series corresponding to an ending point of the transmission event of the RF pulses is determined as the first ending point, generating a reconstructed image from the acquired magnetic resonance signals; and presenting, via a display, the reconstructed image.

2. A signal processor for determining and eliminating radio frequency interference (RF) signals during the process where a magnetic resonance imaging (MRI) device collects an original reference RF signal associated with the physiological signals of the mechanical movement of a measured object, comprising:

a controller, configured to receive the original reference RF signal from at least one receiving antenna group, and receive a time series of a control signal associated with a transmission event of the RF pulses identified with an RF pulse sequence in a time sequence;

wherein the controller comprises a system clock, and the time series of the control signal is synchronized with the original reference RF signal by the system clock;

an identifier, configured to determine an echo train in the original reference RF signal in a repetition time of the RF pulse sequence, wherein the echo train corresponds to the part of the time series associated with the transmission event of the RF pulses in the time sequence; and a signal fitter configured to set sampling points in domains of a starting point and a first ending point of the echo train, and to generate a fitting signal based on the sampling points to eliminate the RF interference signal in the original reference RF signal resulting from the transmission event of the RF pulses during an image acquisition process in which magnetic resonance signals are acquired via the MRI device using the original reference RF signal, wherein a point in the time series corresponding to an ending point of the transmission event of the RF pulses is determined as the first ending point, and wherein the acquired magnetic resonance signals are used by the MRI device to generate and display a reconstructed image.

3. The method as claimed in claim 1, wherein setting the sampling points in the domains of the starting point and the first ending point of the echo train comprises:

calculating amplitude changes of adjacent sampling points in the domains of the starting point and the first ending point, and selecting at least one sampling point with an amplitude change within a first threshold, respectively, in the domains of the starting point and the first ending point as fitting points; and generating the fitting signal based on the fitting points using a fitting algorithm, wherein the first threshold is determined based on a maximum value of the amplitude change in a part of the original reference RF signal that is not affected by the transmission event of the RF pulses.

4. The method as claimed in claim 1, further comprising:

after setting the sampling points in the domains of the starting point and the first ending point of the echo train, and generating a fitting signal based on the sampling points to eliminate the RF interference signal resulted resulting from the transmission event of the RF pulses, the method further comprises:

in response to obtaining a complete repetition time, determining a difference between the original reference RF signal and the fitting signal as the RF interference signal in a repetition time; and in the current repetition time, determining a difference between the original reference RF signal and an average of RF interference signals in a set of previous repetition times as the reference RF signal in the current repetition time.

5. The method as claimed in claim 3, wherein the domain of the first ending point comprises a second ending point determined by the time for the interference level in the echo train to return to a reference level, and wherein setting the sampling points in the domains of the starting point and the first ending point of the echo train comprises:

setting the sampling points in the domain of the second ending point, calculating the amplitude changes of the sampling points, and selecting at least one sampling point with an amplitude change within the first threshold as a fitting point.

6. The method as claimed in claim 1, wherein setting the sampling points in the domains of the starting point and the first ending point of the echo train and generating a fitting signal based on the sampling points to eliminate the RF interference signal resulting from the transmission event of the RF pulses comprises:

comparing a length between the echo train and a selected part of a respiratory cycle, or comparing a length between a time interval of adjacent radio RF transmitted in the echo train, as a second threshold, and a time for the original reference RF signal to return from an interference level to a reference level; and determining whether to divide the echo train based on a result of the above comparison.

7. The method as claimed in claim 6, wherein the act of determining whether to divide the echo train comprises:

in response to the length of the echo train being shorter than the selected part of the respiratory cycle, or in response to the time for the original reference RF signal to return from the interference level to the reference level being longer than the second threshold, selecting a sampling point with an amplitude change within the first threshold in the domain of the starting point of the echo train as a first fitting point and a sampling point with an amplitude change within the first threshold in the domain of the first ending point of the echo train as a second fitting point; and generating the fitting signal by linear fitting of the first fitting point and the second fitting point.

8. The method as claimed in claim 6, wherein the act of determining whether to divide the echo train comprises:

in response to the length of the echo train being longer than the selected part of the respiratory cycle, or in response to the time for the original reference RF signal to return from the interference level to the reference level being shorter than the second threshold, dividing the echo train into a plurality of echo train sections.

9. The method as claimed in claim 8, wherein dividing the echo train into the plurality of echo train sections comprises:

selecting at least one sampling point with an amplitude change within the first threshold, respectively, in the domains of the starting point and the first ending point of each of the echo train sections as fitting points, to form a plurality of fitting points; and fitting the plurality of fitting points by a nonlinear fitting algorithm as the fitting signal.

10. The method as claimed in claim 8, wherein dividing the echo train into the plurality of echo train sections comprises:

selecting at least one sampling point with an amplitude change within the first threshold respectively, in the domains of the starting point and the first ending point of each of the echo train sections as fitting points, to form a plurality of fitting points; and fitting adjacent fitting points by using a linear fitting algorithm and generating a poly-segment fitting signal.

11. The method as claimed in claim 1, wherein the act of synchronizing the time series with the original reference RF signal, and determining the echo train in the original reference RF signal in the repetition time of the pulse sequence comprises:

tracking changes of the time series of the control signal in real time; and detecting, from the time series, a start of the transmission event of the RF pulses.

12. The method as claimed in claim 1, wherein the act of determining the echo train in the original reference radio frequency signal in a repetition time in response to detecting, from the time series, a start of the transmission event of the RF pulses;

reading the original reference RF signal into a buffer, and maintaining changes to the time series; and determining whether the repetition time has ended.

13. The method as claimed in claim 1, wherein the original reference RF signal comprises an original a pilot tone signal.

14. The signal processor as claimed in claim 2, wherein the signal fitter is further configured to:

calculate the amplitude changes of adjacent sampling points in the domains of the starting point and the first ending point of the echo train, and to select at least one sampling point with an amplitude change conforming to a first threshold, respectively, in the domains of the starting point and the first ending point as fitting points; and generate the fitting signal based on the fitting points by using a fitting algorithm, wherein the first threshold is determined based on a maximum value of the amplitude change in the part of the original reference RF signal that is not affected by the transmission event of the RF pulses.

15. The signal processor as claimed in claim 2, further comprising:

a reference RF signal processor configured to, in response to obtaining a complete repetition time, determine the difference between the original reference RF signal and the fitting signal as the RF interference signal in a repetition time, and, in the current repetition time, determine a difference between the original reference RF signal and an average of RF interference signals in a set of previous repetition times as the reference RF signal in the current repetition time.

16. The signal processor as claimed in claim 14, wherein the identifier is further configured to determine the point in the time series corresponding to the ending point of the transmission event of the RF pulses as the first ending point, wherein the domain of the first ending point comprises a second ending point determined by the time for the interference level in the echo train to return to a reference level, and wherein the signal fitter is configured to set the sampling points in the domain of the second ending point, to calculate the amplitude changes of the sampling points, and to select at least one sampling point with an amplitude change within the first threshold as a fitting point.

17. The signal processor as claimed in claim 2, wherein the signal fitter is further configured to compare a length between the echo train and a selected part of a respiratory cycle, or to compare a length between a time interval of adjacent RF pulses transmitted in the echo train, as a second threshold, and a time for the original reference radio RF signal to return from an interference level to a reference level, and to determine whether to divide the echo train based on a result of the comparison.

18. The signal processor as claimed in claim 17, wherein the signal fitter is further configured to, in response to the length of the echo train being shorter than the selected part of the respiratory cycle, or in response to the time for the original reference RF signal to return from the interference level to the reference level being longer than the second threshold, select a first fitting point with an amplitude change within the first threshold in the domain of the starting point of the echo train and a second fitting point with an amplitude change within the first threshold in the domain of the first ending point of the echo train, and generate the fitting signal by fitting of the first fitting point and the second fitting point by using a linear fitting algorithm.

19. The signal processor as claimed in claim 17, wherein the signal fitter is further configured to, in response to the length of the echo train being longer than the selected part of the respiratory cycle, or in response to the time for the original reference RF signal to return from the interference level to the reference level being shorter than the second threshold, divide the echo train into a plurality of echo train sections.

20. The signal processor as claimed in claim 19, wherein the signal fitter is further configured to select at least one sampling point with an amplitude change within the first threshold, respectively, in the domains of the starting point and the first ending point of each of the echo train sections as fitting points, to form a plurality of fitting points, and to fit the plurality of fitting points by a nonlinear fitting algorithm to generate the fitting signal.

21. The signal processor as claimed in claim 19, wherein the signal fitter is further configured to select at least one sampling point with an amplitude change within the first threshold, respectively, in the domains of the starting point and the first ending point of each of the echo train sections as fitting points, to form a plurality of fitting points, and to fit adjacent fitting points by using a linear fitting algorithm and generate a poly-segment fitting signal.

22. The signal processor as claimed in claim 2, wherein the identifier is configured to track changes of the time series of the control signal in real time, and to detect, from the time series, a start of the transmission event of the RF pulses.

23. The signal processor as claimed in claim 2, wherein the identifier is configured to, in response to detecting, from the time series, a start of the transmission event of the RF pulses, read the original reference RF signal into a buffer, track a change of the time series, and determine whether the repetition time has ended.

24. The signal processor as claimed in claim 2, wherein the original reference RF signal comprises a pilot tone signal.

25. A magnetic resonance imaging device for determining relevant physiological signals based on mechanical movement of a measured object, comprising:
   a signal processor as claimed in claim 2.

26. An electronic device, comprising:
   a processor; and
   a non-transitory memory storing a program, wherein the program comprises instructions that, when executed by the processor, causes the processor to execute the signal processing method as claimed in claim 1.

27. A non-transitory computer-readable storage medium storing a program, wherein the program comprises instructions that, when executed by the processor of the electronic device, causes the electronic device to execute the signal processing method as claimed in claim 1.

\* \* \* \* \*